(12) United States Patent
Nagahisa et al.

(10) Patent No.: US 12,057,496 B2
(45) Date of Patent: Aug. 6, 2024

(54) SILICON CARBIDE SEMICONDUCTOR DEVICE AND POWER CONVERTER

(71) Applicant: Mitsubishi Electric Corporation, Tokyo (JP)

(72) Inventors: Yuichi Nagahisa, Tokyo (JP); Shiro Hino, Tokyo (JP); Koji Sadamatsu, Tokyo (JP); Kotaro Kawahara, Tokyo (JP); Hideyuki Hatta, Tokyo (JP); Shingo Tomohisa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 416 days.

(21) Appl. No.: 17/625,340

(22) PCT Filed: Sep. 6, 2019

(86) PCT No.: PCT/JP2019/035249
§ 371 (c)(1),
(2) Date: Jan. 7, 2022

(87) PCT Pub. No.: WO2021/044624
PCT Pub. Date: Mar. 11, 2021

(65) Prior Publication Data
US 2022/0254906 A1 Aug. 11, 2022

(51) Int. Cl.
*H01L 29/16* (2006.01)
*H01L 29/45* (2006.01)
(Continued)

(52) U.S. Cl.
CPC ...... *H01L 29/7393* (2013.01); *H01L 29/1608* (2013.01); *H01L 29/45* (2013.01); *H01L 29/872* (2013.01)

(58) Field of Classification Search
CPC . H01L 29/1608; H01L 29/45; H01L 29/7393; H01L 29/872
(Continued)

(56) References Cited

U.S. PATENT DOCUMENTS 9,006,819 B2* 4/2015 Hino ............... H01L 29/7805
257/77
2011/0278599 A1 11/2011 Nakao et al.
(Continued)

FOREIGN PATENT DOCUMENTS

JP 2003-017701 A 1/2003
JP 2014-175412 A 9/2014
(Continued)

OTHER PUBLICATIONS

International Search Report and Written Opinion mailed on Dec. 3, 2019, received for PCT Application PCT/JP2019/035249, Filed on Sep. 6, 2019, 11 pages including English Translation.

*Primary Examiner* — Monica D Harrison
(74) *Attorney, Agent, or Firm* — XSENSUS LLP

(57) ABSTRACT

An object of the present invention is to suppress the passage of bipolar current in a silicon carbide semiconductor device by reducing a voltage applied to a terminal well region during reflux operations. An SiC-MOSFET includes a plurality of first well regions, a second well region, a third well region in a surface layer of a drift layer, the first, second, and third well regions being of a second conductivity type. The third well region is provided on the side of the second well region opposite to the first well regions. A unit cell that includes the first well regions includes a unipolar diode. The SiC-MOSFET includes a source electrode connected to the unipolar diode and the ohmic electrode and not having ohmic connection with the second well region and the third well region.

12 Claims, 9 Drawing Sheets

(51) Int. Cl.
*H01L 29/739* (2006.01)
*H01L 29/872* (2006.01)

(58) Field of Classification Search
USPC .......................................................... 257/288
See application file for complete search history.

(56) References Cited

U.S. PATENT DOCUMENTS

| | | |
|---|---|---|
| 2012/0205669 A1 | 8/2012 | Miura et al. |
| 2013/0107600 A1 | 5/2013 | Hayashi et al. |
| 2014/0252378 A1 | 9/2014 | Ota et al. |
| 2015/0236012 A1 | 8/2015 | Hino et al. |
| 2016/0079411 A1 | 3/2016 | Hino et al. |
| 2019/0181259 A1 | 6/2019 | Hino et al. |
| 2019/0371935 A1 | 12/2019 | Hatta et al. |
| 2020/0321462 A1 | 10/2020 | Hino et al. |
| 2020/0321995 A1 | 10/2020 | Nagahisa et al. |

FOREIGN PATENT DOCUMENTS

| | | |
|---|---|---|
| WO | 2010/098294 A1 | 9/2010 |
| WO | 2011/045834 A1 | 4/2011 |
| WO | 2013/051170 A1 | 4/2013 |
| WO | 2014/038110 A1 | 3/2014 |
| WO | 2014/162969 A1 | 10/2014 |
| WO | 2017/179102 A1 | 10/2017 |
| WO | 2018/155553 A1 | 8/2018 |
| WO | 2019/123717 A1 | 6/2019 |
| WO | 2019/124384 A1 | 6/2019 |

\* cited by examiner

SILICON CARBIDE SEMICONDUCTOR DEVICE AND POWER CONVERTER

CROSS-REFERENCE TO RELATED APPLICATION

The present application is based on PCT filing PCT/JP2019/035249, filed Sep. 6, 2019, the entire contents of which are incorporated herein by reference.

TECHNICAL FIELD

The present invention relates to a silicon carbide semiconductor device composed of silicon carbide, and a power converter.

BACKGROUND ART

There is a known problem about reliability, in which a continuous flow of forward current, i.e., bipolar current, through pn diodes composed of silicon carbide (SiC) develops stacking faults in crystals and causes a shift in forward voltage. This is considered because recombination energy released at the time of recombination of minority carriers injected via the pn diodes with major carriers causes expansion of the stacking faults, i.e., plane defects, starting from, for example, a basal plane dislocation existing in a silicon carbide substrate. Since the stacking faults inhibit the flow of current, the expansion of the stacking faults reduces current and increases forward voltage, thereby causing deterioration in the reliability of a semiconductor device.

Such an increase in forward voltage can also occur similarly with a vertical metal oxide semiconductor field effect transistor (MOSFET) using silicon carbide. The vertical MOSFET includes parasitic pn diodes (body diodes) between the source and the drain, and when a forward current flows through these body diodes, the reliability of the MOSFET may deteriorate similarly as in the case of pn diodes. Therefore, when body diodes of an SiC-MOSFET are used as freewheeling diodes of an MOSFET, MOSFET characteristics may become degraded.

As one example of methods used to solve such reliability problems as described above caused by the passage of forward current through parasitic pn diodes, there is a method as disclosed in Patent Document 1 in which a forward current is passed through parasitic pn diodes for a long time, i.e., stress is applied to the parasitic pn diodes, in order to measure a change in the forward voltage before and after the application of stress and to exclude (or screen) from a product an element that has experienced a wide variation in the forward voltage. However, with this method, there is a demerit that the time of passing current increases, and if a wafer with a large number of defects is used, a large number of defectives will be produced.

As another method, there is a method in which unipolar diodes energized by only major carriers are included as freewheeling diodes in a semiconductor device such as an MOSFET that serves as a unipolar transistor. For example, Patent Documents 2 and 3 describe methods for including Schottky barrier diodes (SBDs) serving as unipolar diodes in a unit cell of an MOSFET.

In the case where such a unipolar transistor that includes unipolar diodes in an active region is applied to a silicon carbide semiconductor device, it is possible to suppress degradation in the characteristics of the unipolar transistor in the active region by designing diffusion potentials at the unipolar diode (i.e., voltages at which current-carrying operations begin) to become lower than diffusion potentials at pn junctions and thereby preventing the passage of bipolar current through body diodes during reflux operations.

Meanwhile, Patent Document 4 discloses an MOSFET in which an n-type channel epitaxial layer is formed on a p-type well region that serves as an active region. The channel epitaxial layer operates as a unipolar diode with a gate voltage lower than or equal to a threshold voltage. The start-up voltage for the unipolar diode is designed to be lower than the operating voltage for a pn diode configured by a p-type well region and an n-type drift layer. Such an MOSFET can also be regarded as one of unipolar transistors that include unipolar diodes in the active region, and is expected to obtain effects similar to those of an MOSFET including SBDs.

However, even in such a unipolar transistor that includes unipolar diodes in the active region, a parasitic pn diode may be formed in a termination region in which it is difficult to arrange unipolar diodes due to structural reasons, the termination region being a region other than the active region. For example, a terminal well region that juts out on the outer peripheral side of a source electrode may be formed in a region in the vicinity of a gate pad or in the vicinity of the end of a semiconductor device, and a parasitic pn diode may be formed between the terminal well region and a drift layer. In this portion, a Schottky electrode is not formed, and accordingly a unipolar diode is not formed. Due to the absence of the Schottky electrode in the terminal well region, the voltage between the source electrode and the drain electrode is applied to the pn diode configured by the terminal well region and the drift layer, and a bipolar current flows through the pn diode. This phenomenon is hereinafter referred to as "the passage of bipolar current."

The presence of a starting point such as a basal plane dislocation in that portion may expand stacking faults and degrade the tolerance of the transistor. Specifically, a leakage current may be generated in the OFF-state of the transistor, and heat generated by the leakage current may cause a breakdown in elements or circuits.

In order to avoid this problem, the passage of bipolar current through the pn diode configured by the terminal well region and the drift layer may be prevented, and the voltage applied between the source and the drain, for example, may be limited to a fixed value or less while the semiconductor device is operating. As one example of such a method, chip size may be increased to reduce differential resistance of built-in SBDs per chip so that the source-drain voltage generated by the passage of reflux current is reduced. This method, however, has demerits such as a large chip size and high cost.

As one example of methods for suppressing forward operations of the pn diodes configured by the terminal well region and the drift layer without increasing chip size, there is a method for increasing resistance in a current-carrying path formed between the source electrode and each point in the terminal well region. As a method for increasing the resistance in the current-carrying path, Patent Document 5 discloses a configuration that includes increased contact resistance between the terminal well region and the source electrode. With this configuration, when a bipolar current flows through a pn diode configured by the terminal well region and the drift layer, the resistance component of the contact resistance causes a voltage drop and thereby causes alienation between the source potential and the potential in the terminal well region, so that the forward voltage applied to the pn diode is reduced by an amount corresponding to the alienation. Accordingly, it is possible to suppress the passage of bipolar current.

Meanwhile, in a wide-gap semiconductor device typically composed of silicon carbide, the occurrence of an element breakdown due to the passage of displacement current through a well region during switching is known as a particularly outstanding phenomenon. When a silicon carbide semiconductor device with an MOS structure is switched, a displacement current flows in the planar direction of elements inside a p-type well region having a relatively large area, and this displacement current and the sheet resistance of the well region create a high voltage in the well region. This causes a dielectric breakdown in the insulation film between electrodes formed via the insulation film on the well region, and thereby causes an element breakdown. For example, in the case where the potential in the well region varies to 50V or more, and a gate electrode with a potential of approximately 0V is formed on the well region via a silicon oxide film with a thickness of 50 nm, a high electric field of 10 MV/cm may be applied to the silicon oxide film and cause a dielectric breakdown.

There are the following two reasons why this phenomenon occurs noticeably in the wide-gap semiconductor device. The first reason is that the impurity level in the p-type well region formed in the wide-gap semiconductor is deeper than the impurity level in the p-type well region formed in silicon, and therefore the sheet resistance of the p-type well region formed in the wide-gap semiconductor becomes considerably higher than the sheet resistance of the p-type well region formed in the silicon. The second reason is that the wide-gap semiconductor device employs an n-type drift layer having a low resistance and a high impurity concentration by making use of the fact that the breakdown electric field of a wide-gap semiconductor is higher than the breakdown electric field of a silicon semiconductor. Accordingly, in the wide-gap semiconductor device, the depletion layer generated at the pn junction formed between the n-type drift layer and the p-type well region has a considerably larger capacitance than in the silicon semiconductor device, and as a result, a large displacement current flows during switching.

As the switching speed increases, the displacement current increases and the voltage to be generated in the well region increases. As one example of methods for reducing the voltage generated by the displacement current, for example, Patent Document 6 proposes a method for forming a low-resistance p-type layer in part of a p-type well region.

In summary, a silicon carbide MOSFET that includes unipolar diodes in the active region is characterized in offering easy passage of bipolar current from some p-type well regions such as an outer peripheral region. To reduce the passage of bipolar current, a conceivable measure is to increase the resistance between the p-type well region and the source electrode. However, with this measure, a large voltage is generated by the passage of displacement current during switching. During reflux operations, these p-type well regions offer high resistance and do not pass a current, but during the passage of displacement current, the p-type well region is required not to generate such a voltage that causes a breakdown in the insulation film formed thereon.

As a structure that satisfies these requirements, for example, a structure as described in Patent Document 7 is conceivable in which the connection between a source electrode and a p-type well region such as an outer peripheral region is implemented by nonlinear resistance such as a pnp slit structure. With this structure, it is possible to suppress the passage of bipolar current with a voltage of the order of volts that is applied during reflux operations and to prevent a breakdown by yielding before reaching such a voltage that causes a breakdown in the insulation film.

Alternatively, a measure is also conceivable in which a conductive layer connected to the source electrode and not having ohmic connection with a p-type well region such as an outer peripheral region is formed on the p-type well region, and the source electrode is connected to the p-type well region via the capacitance of a depletion layer of the p-type well region in order to suppress the passage of bipolar current during reflux operations while allowing the passage of displacement current with low voltages.

PRIOR ART DOCUMENTS

Patent Documents

Patent Document 1: Japanese Patent Application Laid-open No. 2014-175412
Patent Document 2: Japanese Patent Application Laid-open No. 2003-017701
Patent Document 3: International Publication No. WO/2014/038110
Patent Document 4: International Publication No. WO/2013/051170
Patent Document 5: International Publication No. WO/2014/162969
Patent Document 6: International Publication No. WO/2010/098294
Patent Document 7: International Publication No. WO/2017/179102

SUMMARY

Problem to be Solved by the Invention

As described above, in the element such as an SBD-embedded MOSFET that includes unipolar diodes in the active region, the p-type well region in the termination does not have ohmic connection with the source electrode, i.e., the p-type well region is electrically isolated from the source electrode, in order to suppress the passage of bipolar current in the terminal well region during reflux operations. Therefore, the terminal well region has to be either formed separately from the active region or connected with considerably high resistance to the active region.

It is difficult for a high-voltage element to satisfy the above-described requirements. Since the active region includes unipolar diodes, the passage of large unipolar current is allowed during reflux operations while operations of body diodes are suppressed. At this time, in the high-voltage element, a high voltage is applied to the drain voltage due to the high resistance of the drift layer. Then, due to the presence of the built-in unipolar diodes, only a voltage that does not activate pn diodes is applied to the well regions, which configure the body diodes in the active region.

In the terminal well region, on the other hand, a voltage corresponding to the amount of voltage drop caused by the passage of unipolar current through the drift layer is applied, in addition to the voltage applied to the body diodes in the active region. The voltage actually applied to the terminal well region varies depending on the degree of voltage drop caused by the drift layer and the distance up to which the terminal well region is formed from the closest unipolar diode. In general, the terminal well region is formed to contain a gate line region and a gate pad region and is formed up to a region that is away enough from the closest unipolar diode. Therefore, a voltage obtained by approximately subtracting a diffusion voltage at the pn junction from the drain voltage is applied to the terminal well region, and the value of this voltage generally increases with increasing resistance of the drift layer as the product offers a higher voltage.

Thus, depending on usage conditions, the increase in the voltage applied to the terminal well region makes it difficult to provide electrical isolation between the source electrode and the terminal well region and between the terminal well region and the well region that serves as the active region connected to the source region. As a result, the occurrence of punch-through produces continuity between the well region in the active region and the well region in the termination region and causes the passage of bipolar current from the terminal well region.

Even in the case where the pnp slit structure disclosed in Patent Document 7 is used to provide isolation between the terminal well region and the well region connected to the source electrode, there still remains a problem with a high-voltage element that the punch-through phenomenon occurring at the pnp slit can cause the passage of bipolar current from the terminal well region when a negative voltage of 50V at most is applied to the drain during reflux operations.

The present invention has been made in order to solve problems as described above, and it is an object of the present invention to suppress the passage of bipolar current in a terminal well region during reflux operations in a silicon carbide semiconductor device.

Means to Solve the Problem

A silicon carbide semiconductor device according to the present invention includes a semiconductor substrate composed of silicon carbide of a first conductivity type, a drift layer of the first conductivity type formed on the semiconductor substrate, a plurality of first well regions of a second conductivity type provided in a surface layer of the drift layer, a second well region of the second conductivity type provided in the surface layer of the drift layer, with a second space region of the first conductivity type sandwiched between the second well region and an outermost first region out of the plurality of first well regions, a third well region of the second conductivity type provided on a side of the second well region opposite to the plurality of first well regions in the surface layer of the drift layer, with a third space region of the first conductivity type sandwiched between the third well region and the second well region, a source region of the first conductivity type formed in surface layers of the plurality of first well regions, an ohmic electrode formed on the plurality of first well regions and having ohmic connection with the plurality of first well regions, a gate insulating film formed on the plurality of first well regions, the second well region, and the third well region, a gate electrode formed on the gate insulating film, and a gate pad formed on the gate insulating film on the third well region. The silicon carbide semiconductor device further includes a unipolar diode provided in a unit cell including the plurality of first well regions, and a source electrode connected to the unipolar diode and the ohmic electrode and not having ohmic connection with the second well region and the third well region.

Effects of the Invention

In the silicon carbide semiconductor device according to the present invention, the second and third well regions in the termination region do not have ohmic connection with the source electrode in the termination region. Thus, a bipolar current is less likely to flow through the second and third well regions during reflux operations. These and other objects, features, aspects and advantages of the present invention will become more apparent from the following detailed description of the present invention when taken in conjunction with the accompanying drawings.

DESCRIPTION OF EMBODIMENTS

Figure 1:
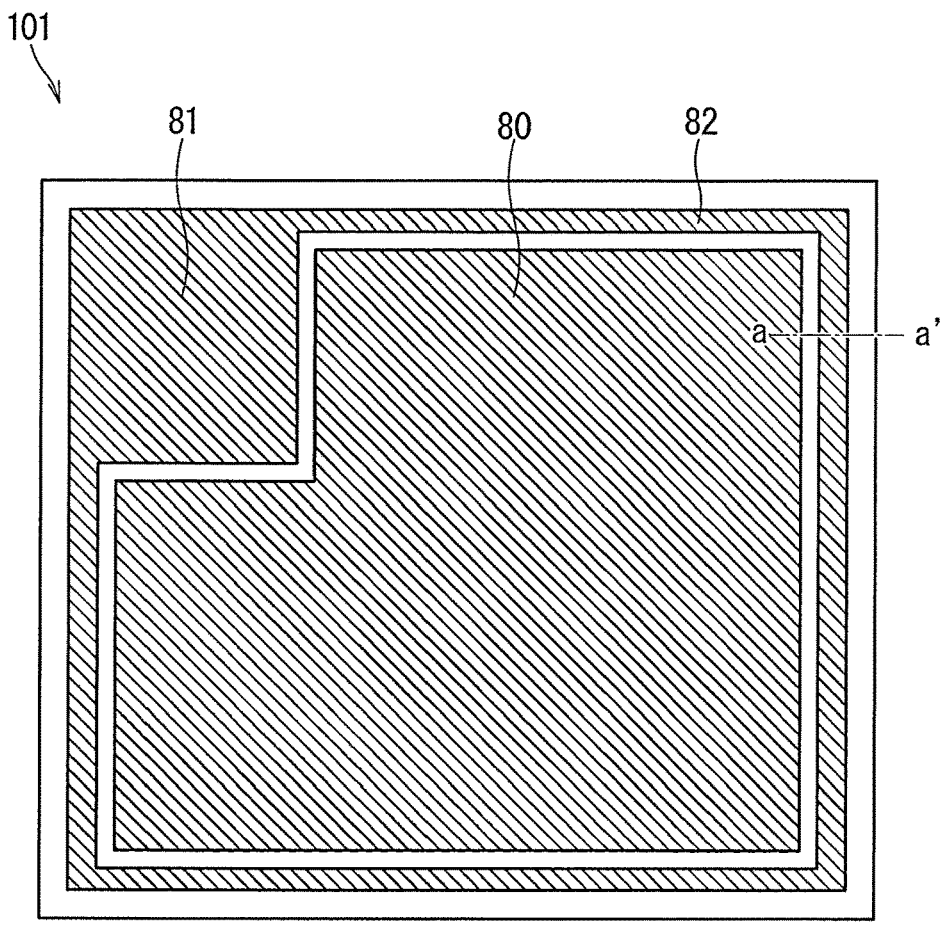
FIG. 1 is a top view of an SiC-MOSFET according to Embodiment 1.

Hereinafter, embodiments will be described with reference to the accompanying drawings. Since the drawings are illustrated in schematic form, the relative sizes and positions of images illustrated in different drawings are not always accurate and can be changed appropriately. In the following description, the same constituent elements are illustrated with the same reference numerals and assumed to have the same names and the same functions. Thus, detailed descriptions of these constituent elements may be omitted in some cases.

In the embodiments described in the specification of the present invention, an n-channel silicon carbide MOSFET serving as a silicon carbide (SiC) semiconductor device is given as an example of the semiconductor device, in which a first conductivity type is an n type and a second conductivity type is a p type. Descriptions as to high and low of potentials are given for the case where the first conductivity type is an n type and the second conductivity type is a p type. Thus, when the first conductivity type is a p type and the second conductivity type is an n type, descriptions as to high and low of potentials are reversed.

In the specification of the present invention, a region in which unit cells are arranged at regular intervals in a semiconductor device as a whole is regarded as an active region, and a region other than the active region is regarded as a termination region.

A. Embodiment 1

A-1. Configuration

First, a configuration of a silicon carbide semiconductor device according to Embodiment 1 will be described.

FIG. 1 is a schematic plane view of a silicon carbide MOSFET (hereinafter, simply referred to as an "SiC-MOSFET") 101 that includes Schottky diodes (SBD), each serving as a silicon carbide semiconductor device according to Embodiment 1, as viewed from above. In FIG. 1, a gate pad 81 is formed on part of the upper surface of the SiC-MOSFET 101, and a source electrode 80 is formed adjacent to the gate pad 81. Moreover, a gate line 82 is formed extending from the gate pad 81. In the specification of the present invention, various SiC-MOSFETs according to embodiments will be described below, and FIG. 1 is a top view of such an SiC-MOSFET according to each embodiment.

Figure 2:
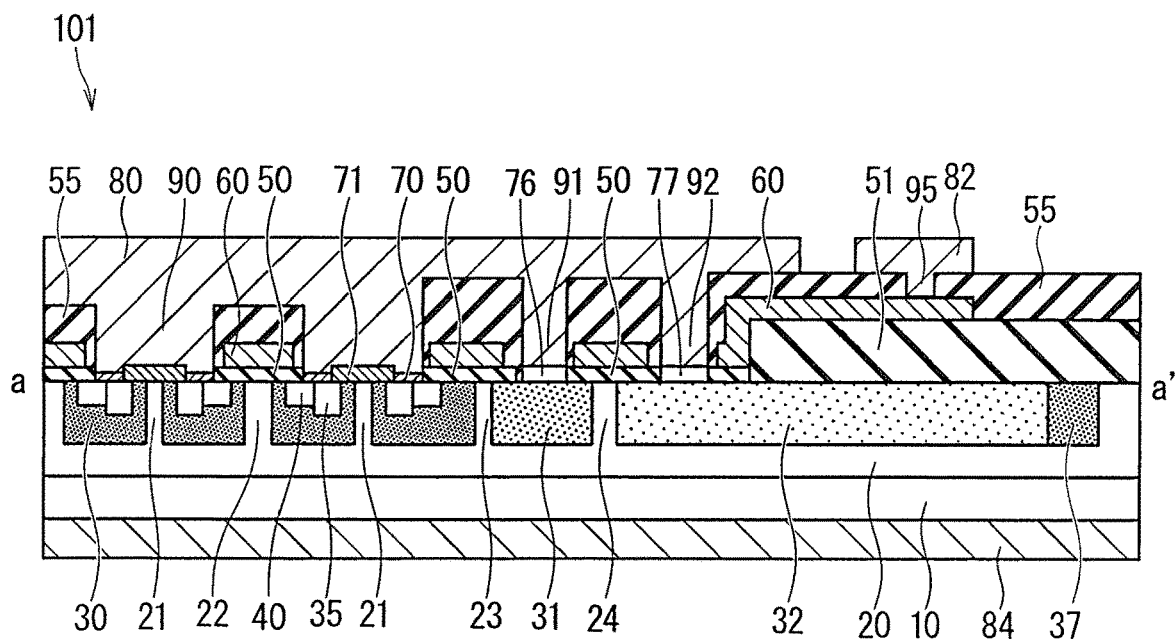
FIG. 2 is a sectional view of the SiC-MOSFET according to Embodiment 1, taken along a line a-a' in FIG. 1.
Figure 3:
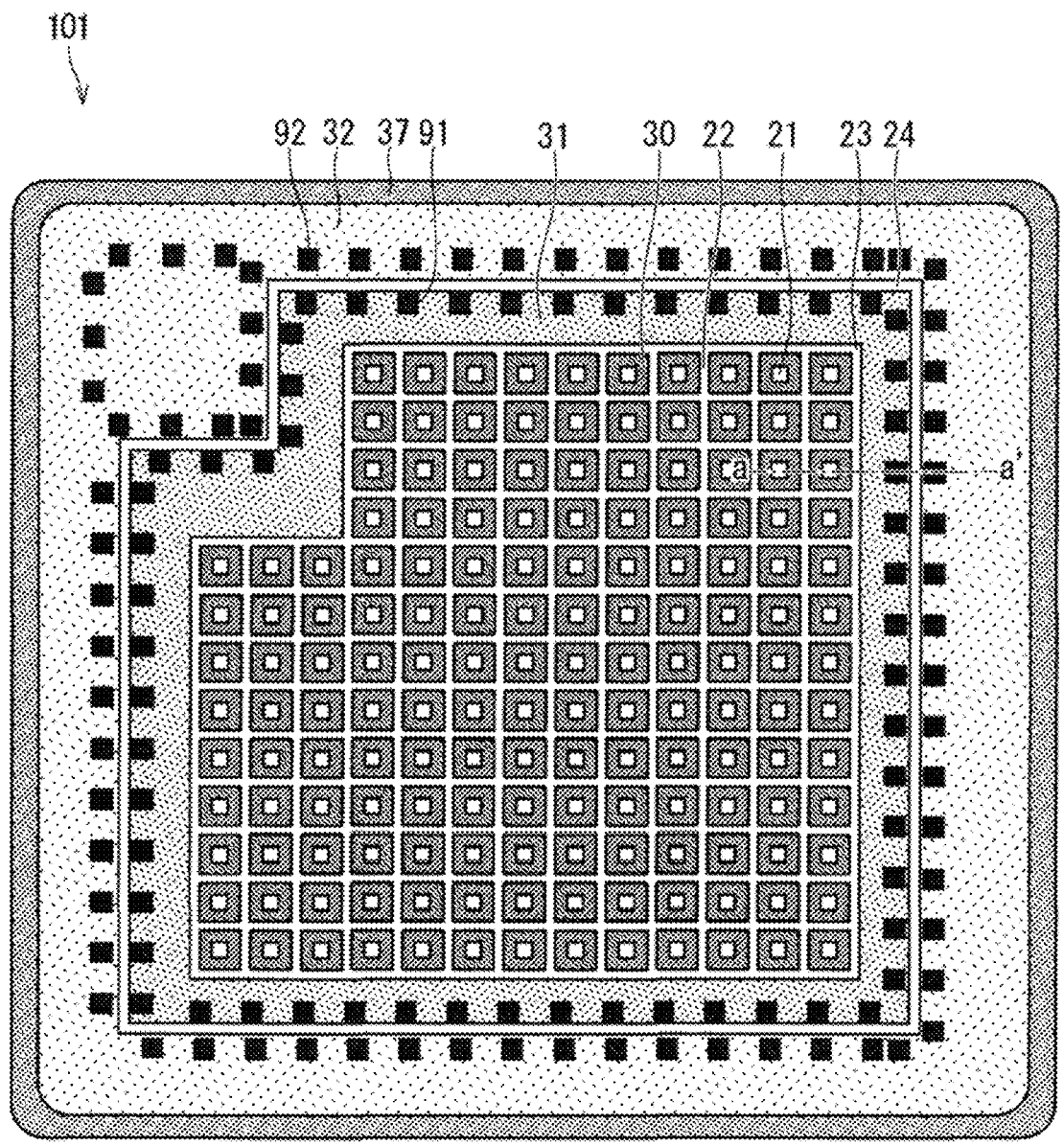
FIG. 3 is a top view mainly illustrating a portion of a silicon carbide semiconductor in the SiC-MOSFET according to Embodiment 1.

FIG. 2 is an illustration of a section of the SiC-MOSFET 101 taken along a line a-a' from the source electrode 80 to the gate line 82. FIG. 3 is a top view of the SiC-MOSFET 101 illustrating mainly a portion of a silicon carbide semiconductor.

In FIG. 2, a drift layer 20 composed of n-type silicon carbide is formed on a surface of a semiconductor substrate 10 composed of n-type silicon carbide having a low resistance. As illustrated in FIG. 3, the drift layer 20 includes a surface layer in which a third well region 32 composed of p-type silicon carbide is provided in a position corresponding almost to the region where the gate line 82 illustrated in FIG. 1 is provided.

In the surface layer of the drift layer 20, as illustrated in FIG. 2, a plurality of first well regions 30 composed of p-type silicon carbide are provided under the region where the source electrode 80 illustrated in FIG. 1 is provided. Each first well region 30 includes a surface layer in which a source region 40 composed of n-type silicon carbide is formed in a positon inward at a predetermined distance from the outer periphery of the first well region 30.

In the surface layer of each first well region 30, a contact region 35 composed of p-type silicon carbide with a low resistance is also formed inward of the source region 40. Each first well region 30 further includes a space region 21 that is formed inward of the contact region 35 and penetrates the first well region 30 in a thickness direction. The space regions 21 are also referred to as first space regions. The space regions 21 are composed of n-type silicon carbide of the same type as that of the drift layer 20. The n-type impurity concentration in the space regions 21 may be the same as the n-type impurity concentration in the drift layer 20, or may be higher or lower than the n-type impurity concentration in the drift layer 20. The space regions 21 may be included in part or in its entirety in a trench structure that is formed by being carved into the surface of the drift layer 20.

On the upper surface of each space region 21, a Schottky electrode 71 is formed in Schottky connection with the space region 21. It is preferable that the Schottky electrode 71 is formed so as to include at least the corresponding space region 21 as viewed from above.

On the upper surface of each source region 40, an ohmic electrode 70 is formed. On the ohmic electrode 70 and the Schottky electrode 71, the source electrode 80 is formed so as to be connected to the contact region 35. Each first well region 30 can readily exchange electrons and holes with the ohmic electrode 70 via the contact region 35 having a low resistance.

A region of the drift layer 20 that is located between each pair of adjacent first well regions 30 is an n-type space region 22. The n-type impurity concentration in the space region 22 may be the same as the n-type impurity concentration in the drift layer 20, or may be higher or lower than the n-type impurity concentration in the drift layer 20. A gate insulating film 50 is formed on the upper surfaces of the first well regions 30, the space region 22 between each pair of adjacent first well regions 30, and the source region 40 in each first well region 30. On the gate insulating film 50 at least above the first well regions 30, a gate electrode 60 is formed. In the surface layer of each first well region 30, the portion that faces the gate electrode 60 via the gate insulating film 50 is referred to as a channel region.

In the surface layer of the drift layer 20, a second well region 31 is formed outward of the outermost peripheral first well region 30, with a space region 23 sandwiched therebetween. In other words, the space region 23 is a region located between the first well regions 30 and the second well region 31. The space region 23 is composed of n-type silicon carbide of the same type as that of the drift layer 20. The n-type impurity concentration in the space region 23 may be the same as the n-type impurity concentration in the drift layer 20, or may be higher or lower than the n-type impurity concentration in the drift layer 20. The space region 23 and the first and second well regions 30 and 31 that sandwich the space region 23 from both sides form a pnp contact structure in a planar direction. In the specification of the present invention, such a structure is referred to as a pnp slit. The space region 23 is also referred to as a second space region. The gate insulating film 50 is also formed on the second well region 31. On the gate insulating film 50 above the second well region 31, the gate electrode 60 is formed so as to be electrically connected to the gate electrode 60 formed above the first well regions 30.

The second well region 31 is adjacent to the first well regions 30 via the space region 23. The second well region 31 has non-ohmic connection with the source electrode 80. In FIG. 2, an interlayer insulation film 55, the gate electrode 60, and the gate insulating film 50 above the second well region 31 are opened so as to form a second-well-region contact hole 91, and a first non-ohmic contact region 76 is formed in the bottom of the second-well-region contact hole 91. Thus, the second well region 31 is connected to the source electrode 80 via the first non-ohmic contact region 76. However, the configuration illustrated in FIG. 2 is merely an example, and another configuration may be used instead as long as the second well region 31 has non-ohmic connection with the source electrode 80.

For example, the second well region 31 may have Schottky connection with the source electrode 80. Alternatively, the source electrode 80 and the second well region 31 may have diode connection at a pn junction by forming an n-type silicon carbide region on the second well region 31 and establishing ohmic connection between the n-type silicon carbide region and the source electrode 80. As another alternative, instead of establishing explicit contact with the source electrode 80, the space region 23 may be designed to have a width shorter than or equal to a fixed value so as to establish non-ohmic connection between the second well region 31 and the source electrode 80 via a nonlinear resistance using punch-through occurring in the pnp slit. As yet another alternative, the second well region 31 may be divided by n-type space regions and composed of a plurality of regions. In that case, all of the second well regions 31 do not necessarily have to be located adjacent to the first well regions via the space region 23, and the gate insulating film 50 does not necessarily have to be formed on all of the second well regions 31.

In the surface layer of the drift layer 20, the third well region 32 is formed outward of the second well region 31, with a space region 24 sandwiched therebetween. In other words, the space region 24 is a region located between the second well region 31 and the third well region 32. The space region 24 is also referred to as a third space region. The space region 24 is composed of n-type silicon carbide of the same type as that of the drift layer 20. The n-type impurity concentration in the space region 24 may be the same as the n-type impurity concentration in the drift layer 20, or may be higher or lower than the n-type impurity concentration in the drift layer 20. The space region 24 and the second and third well regions 31 and 32 that sandwich the space region 24 from both sides form a pnp contact structure, i.e., a pnp slit, in a planar direction.

The third well region 32 has non-ohmic connection with the source electrode 80. In FIG. 2, the interlayer insulation film 55, the gate electrode 60, and the gate insulating film 50 above the third well region 32 are opened so as to form a third-well-region contact hole 92, and a second non-ohmic contact region 77 is formed in the bottom of the third-well-region contact hole 92. Thus, the third well region 32 is connected to the source electrode 80 via the second non-ohmic contact region 77. However, the configuration illustrated in FIG. 2 is merely an example, and any other configuration may be used instead as long as the third well region 32 has non-ohmic connection with the source electrode 80.

For example, the third well region 32 may have Schottky connection with the source electrode 80. Alternatively, the third well region 32 may have diode connection with the source electrode 80 at a pn junction by forming an n-type silicon carbide region on the third well region 32 and establishing ohmic connection between the n-type silicon carbide region and the source electrode 80. As another alternative, instead of establishing explicit contact with the source electrode 80, the space region 24 may be designed to have a width shorter than or equal to a fixed value so as to establish non-ohmic connection between the third well region 32 and the source electrode 80 via a nonlinear resistance using punch-through occurring in the pnp slit.

The interlayer insulation film 55 is formed between the gate electrode 60 and the source electrode 80. The gate electrode 60 above the third well region 32 is connected to the gate line 82 via a gate contact hole 95 formed by opening the interlayer insulation film 55. On the outer peripheral side of the third well region 32, i.e., on the side opposite to the first well regions 30, a JTE region 37 is formed in the surface layer of the drift layer 20. The JTE region 37 is composed of p-type silicon carbide, and the impurity concentration in the JTE region 37 is lower than the impurity concentration in the second well region 31.

On the upper surface of the third well region 32, either the gate insulating film 50 or a field insulating film 51 that has a greater thickness than the gate insulating film 50 is formed. The field insulating film 51 may be formed to above the second well region 31 astride the space region 24.

In the active region, the ohmic electrode 70, the Schottky electrode 71, and the source electrode 80 on the contact region 35 are connected to the source electrode 80 on the interlayer insulation film 55 via the first-well-region contact hole 90, which is formed penetrating the interlayer insulation film 55 and the gate insulating film 50.

On the back side of the semiconductor substrate 10, a drain electrode 84 is formed.

In the space regions 23 and 24, when the punch-through voltage is limited to a fixed value during switching, using the punch-through phenomenon occurring in the pnp slit, a punch-through voltage V given as a solution to x=W in the linear Poisson's equation below may be controlled as in PTL 7, where W is the slit width.

Expression 1

$$\frac{d^2\varphi}{dx^2} = -\frac{qN}{\epsilon} \quad (1)$$

In the Poisson's equation above, the punch-through voltage V, which is a solution to x=W, is expressed as follows:

Expression 2

$$V = \frac{qNW^2}{2\epsilon} \quad (2)$$

where $\varphi$ is the potential distribution, x is the distance in the planar direction, q is the elementary electric charge, N is the effective impurity concentration, and $\epsilon$ is the dielectric constant of semiconductor.

Next, a planar positional relationship of the first, second, and third well regions 30, 31, and 32 will be described with reference to FIG. 3. First, the second well region 31 is formed so as to surround the first well regions 30, which form the active region of the SiC-MOSFET 101. Then, the third well region 32 is formed so as to surround the outer periphery of the second well region 31. Thus, the gate line 82 or the gate pad 81 is formed mainly on the third well region 32.

Although FIG. 3 illustrates a case in which the gate line 82 is formed so as to surround the active region, a case is also conceivable in which the gate pad 81 or the gate line 82 is formed in the vicinity of the center line of the SiC-MOSFET 101. In this case as well, the third well region 32 is formed below the gate pad 81 and the gate line 82, and the second well region 31 is formed between the third well region 32 and the first well regions 30.

A-2. Manufacturing Method

Next, a method of manufacturing the SiC-MOSFET 101, which is the silicon carbide semiconductor device according to the present embodiment, will be described.

First, the drift layer 20 is epitaxially grown to a thickness of 5 to 200 μm on the semiconductor substrate 10 by chemical vapor deposition (CVD). The semiconductor substrate 10 has a first main surface having a (0001) plane orientation with a cut-off angle and is of 4H polytype and composed of n-type silicon carbide having a low resistance.

The drift layer 20 is composed of silicon carbide having an n-type impurity concentration of $1 \times 10^{14}$ to $1 \times 10^{17}$ cm$^{-3}$.

Then, an implantation mask of, for example, a photoresist is formed on a predetermined region of the surface of the drift layer 20, and p-type impurity ions, namely aluminum (Al) ions, are implanted into the surface. At this time, the depth of Al ion implantation is set on the order of 0.3 to 3 μm so as not to exceed the thickness of the drift layer 20. The doping concentration of Al is set in the range of $1 \times 10^{17}$ to $1 \times 10^{19}$ cm$^{-3}$ so as to become higher than the impurity concentration in the drift layer 20. Thereafter, the implantation mask is removed. The region into which Al ions are implanted by this step forms the first, second, and third well regions 30, 31, and 32.

Next, an implantation mask of, for example, a photoresist is formed on the surface of the drift layer 20, and p-type impurity ions, namely Al ions, are implanted into the surface. At this time, the depth of Al ion implantation is set on the order of 0.3 to 3 μm so as not to exceed the thickness of the drift layer 20. The doping concentration of Al is set in the range of $1 \times 10^{16}$ to $1 \times 10^{18}$ cm$^{-3}$ so as to become higher than the impurity concentration in the drift layer 20 and lower than the impurity concentration in the first well region 30. Thereafter, the implantation mask is removed. The region into which Al ions are implanted by this step forms the JTE region 37. Similarly, the contact region 35 is formed by implanting Al ions into a predetermined region of the surface of each first well region 30 with a higher impurity concentration than the impurity concentration in the first well region 30.

Then, an implantation mask of, for example, a photoresist is formed so as to open a predetermined portion of the inside of each first well region 30 in the surface of the drift layer 20, and n-type impurity ions, namely nitrogen (N) ions, are implanted into the surface. The depth of N ion implantation is set to be shallower than the thickness of the first well region 30. The doping concentration of N is set in the range of $1 \times 10^{18}$ to $1 \times 10^{21}$ cm$^{-3}$ so as to exceed the p-type impurity concentration in the first well region 30. Out of the region into which N ions are implanted by this step, a region of the n type forms the source region 40.

Next, annealing is performed at a temperature of 1300 to 1900° C. for 30 seconds to one hour in an inert gas atmosphere such as an argon (Ar) gas by heat treatment equipment. This annealing electrically activates the implanted N and Al ions.

Then, the field insulating film 51 composed of silicon oxide with a film thickness of 0.3 to 2 μm is formed on a region of the silicon carbide semiconductor layer that excludes the active region and that corresponds almost to the region where the first well region 30 is formed, using a technique such as CVD or photolithography.

Next, the surface of silicon carbide that is not covered with the field insulating film 51 is thermally oxidized to form a silicon oxide film that forms the gate insulating film 50 with a desired thickness. Then, a polycrystalline silicon film having conductivity is formed by low-pressure CVD on the gate insulating film 50 and the field insulating film 51 and is patterned into the gate electrode 60. Then, the interlayer insulation film 55 composed of silicon oxide is formed by low-pressure CVD. Then, the first-well-region contact hole 90 is formed, which penetrates the interlayer insulation film 55 and the gate insulating film 50 and reaches the contact region 35 and the source region 40 in the active region. The second-well-region contact hole 91 that reaches the second well region 31 and part of the third-well-region contact hole 92 that reaches the third well region 32 are formed in a similar manner. At this time, the first-well-region contact hole 90 is completely opened to the semiconductor substrate 10 by a method such as increasing the number of photomasks by one and adopting two-stage processing, but the second-well-region contact hole 91 and the third-well-region contact hole 92 are not completely opened in order to prevent the formation of silicide in subsequent steps.

As a matter of course, even if silicide has been formed, the above may not apply to the case in which the acceptor concentration is designed so as not to provide ohmic connection between the second well region 31 and the third well region 32. In this case, the number of masks required can be reduced by one.

Next, after a metal film composed principally of Ni is formed by sputtering or any other technique, heat treatment is performed at a temperature of 600 to 1100° C. so as to cause a reaction between the metal film composed principally of Ni and the silicon carbide layer in the first-well-region contact hole 90 and to form silicide between the silicon carbide layer and the metal film. Then, a residual metal film other than the silicide produced by the reaction is removed by wet etching. In this way, the remaining silicide forms the ohmic electrode 70. Since the second-well-region contact hole 91 and the third-well-region contact hole 92 are not completely opened, silicide is not formed in the second well region 31 and the third well region 32.

Then, a metal film composed principally of Ni is formed on the back side of the semiconductor substrate 10, i.e., the second main surface, and a back ohmic electrode (not shown) is formed by heat treatment.

Next, the interlayer insulation film 55 located in positions corresponding to the interlayer insulation film 55, the gate insulating film 50, and the gate contact hole 95 above the space region 21 is removed by, for example, patterning using a photoresist. At the same time, the interlayer insulation film 55 remaining in the bottoms of the second-well-region contact hole 91 and the third-well-region contact hole 92 is also removed. As an example of methods for removing the interlayer insulation film, wet etching is employed in order not to damage the surface of the silicon carbide layer that forms a Schottky interface.

Then, a metal film that forms the Schottky electrode is deposited by sputtering or any other technique, and the Schottky electrode 71 is formed above the space region 21 in the first-well-region contact hole 90 by patterning using, for example, a photoresist.

At the same time, Schottky non-ohmic contacts (the first non-ohmic contact region 76, the second non-ohmic contact region 77) are also formed by depositing a metal film in the second-well-region contact hole 91 and the third-well-region contact hole 92.

Next, a line metal such as Al is formed by sputtering or vapor deposition on the surface side of the semiconductor substrate 10 and processed into a predetermined shape by photolithography so as to form the source electrode 80, the gate pad 81, and the gate line 82. The source electrode 80 is in contact with the ohmic electrode 70, the Schottky electrode 71, the first non-ohmic contact region 76, and the second non-ohmic contact region 77. The gate pad 81 is in contact with the gate electrode 60.

Finally, the drain electrode 84 of a metal film is formed on the surface of the back ohmic electrode (not shown) formed on the back side of the semiconductor substrate 10. This completes the SiC-MOSFET 101 illustrated in FIGS. 1 to 3.

A-3. Operations

Next, operations of the SiC-MOSFET 101 will be described. Hereinafter, an SiC-MOSFET using 4H silicon carbide as a semiconducting material will be described by way of example. In this case, the diffusion potential at the pn junction is approximately 2V.

Hereinafter, a reflux operation will be described mainly. The drain voltage becomes lower than the source voltage during reflux operations. Here, the source voltage is a voltage at the source electrode 80, and the drain voltage is a voltage at the drain electrode 84. The drain voltage is in the range of minus several volts to minus several tens volts. In the active region, the space region 21 and the Schottky electrode 71 form an SBD, and this SBD is turned on with a lower voltage than the first well regions 30. Thus, in principle, a reflux current flows through the SBD and does not flow through the first well region 30. In the termination region, if the second well region 31 and the third well region 32 have ohmic connection with the source electrode 80, most of the potential difference between the source and the drain is applied to the pn junction formed between the drift layer 20 and the second and third well regions 31 and 32. The flow of forward current through the pn diode formed by the second well region 31 and the drift layer 20 results in a flow of large bipolar current. However, in the SiC-MOSFET 101, the second well region 31 and the third well region 32 do not have ohmic connection with the source electrode 80. Therefore, in principle, a bipolar current does not flow through the second and third well regions 31 and 32 during reflux operations until the negative drain voltage applied during reflux operations reaches a certain degree of value.

On the other hand, for example, in the case where the film thickness of the drift layer 20 is increased to an extreme in order to hold a withstand voltage as in the case of a high-voltage product, the voltage to be applied to the second and third well regions 31 and 32 during reflux operations will increase. This is due to the fact that a maximum current density ($J_{ucmax}$) in the active region is principally determined by the start-up voltage of the built-in SBD and the resistance of the space region 21 and does not depend on the resistance of the drift layer 20.

Assume that $R_{SBD}$ ($\Omega$ cm$^2$) is the combined resistance per unit area of the portion corresponding to the space region 21 of the SBD configured by the Schottky electrode 71 included in the active region, $V_{SBD}$ is the start-up voltage of the SBD, and $V_{pn}$ is the start-up voltage of the pn diodes configured by the first well regions 30 and the drift layer 20. In this case, the maximum current density $J_{ucmax}$ at which current can flow through the active region before the start-up of the pn diode and the start of bipolar current flow can be approximately expressed by the following expression:

Expression 3

$$J_{ucmax} = \frac{V_{pn} - V_{SBD}}{R_{SBD}} \quad (3)$$

On the other hand, the voltage $V_{ds}$ applied at this time between the drain and the source can be expressed as follows, where $R_{drift}$ ($\Omega$ cm$^2$) is the resistance per unit area of the drift layer 20, and the resistance per unit area of the semiconductor substrate 10 is ignored.

Expression 4

$$V_{ds} = -V_{SBD} - J_{ucmax} * R_{drift} \quad (4)$$

Here, the assumption is made that the chip is designed such that the chip exothermic density becomes constant when $J_{ucmax}$ is the current density in the active region. The chip exothermic density $E_{diode}$ during reflux operations can be expressed by the following expression:

Expression 5

$$E_{diode} = V_{SBD} * J_{ucmax} + (R_{drift} + R_{SBD}) * J_{ucmax}^2 \quad (5)$$

In the case of a high-voltage product, the drift layer resistance $R_{drift}$ relatively increases and the voltage satisfying $J_{ucmax}$ also increases. Thus, if the assumption is made that the contribution of $V_{SBD}$ and $R_{SBD}$ to $E_{diode}$ can be ignored, the chip is designed as expressed by the following expression:

Expression 6

$$E_{diode} = R_{drift} * J_{ucmax}^2 = \text{constant} \quad (6)$$

Accordingly, if the withstand voltage is increased k times, the thickness of the drift layer 20 is increased k times, the impurity concentration becomes 1/k, and the resistance of the drift layer 20 becomes k$^2$ times. At this time, $E_{diode}$ can be kept constant if $J_{ucmax}$ is increased 1/k times. Accordingly, if the term of $V_{SBD}$ is ignored, the voltage $V_{ds}$ applied during reflux operations is increased k$^2$ times in Expression 4. Therefore, design constraints on the non-ohmic contact structure necessary to suppress the passage of bipolar current through the second and third well regions 31 and 32, that is, what volts the voltage $V_{ds}$ should be reduced to prevent the passage of current in the aforementioned non-ohmic contact structure, is increased k times in proportion to the withstand voltage. For this reason, it is extremely difficult in the non-ohmic contact structure to achieve both the feature of reducing resistance with a constant voltage during turn-off and turn-on operations, which will be described later, and the feature of suppressing the passage of bipolar current during reflux operations. This trend is particularly noticeable specifically in the case of a high-voltage product that includes the drift layer 20 having an impurity concentration of 5×10$^{15}$ cm$^{-3}$ or less and a withstand voltage of 3 kV or more.

The feature of the SiC-MOSFET 101 is that the chip termination region includes the space region 24. It is preferable that the space region 24 is provided at a closer distance than at least the drift layer 20, when viewed from the SBD configured by the outermost peripheral space region 21 (hereinafter, referred to as the "outermost peripheral SBD"). At this time, the potential difference applied to the second well region 31 located inward of the space region 24 during reflux operations is smaller than the potential difference between the source and the drain. This is because a voltage drop caused by the current flowing from the SBD increases in accordance with the distance from the outermost peripheral SBD. Specifically, when viewed in section in the depth direction of the device and in the outer circumferential direction, equipotential lines generated by the voltage drop caused by the reflux current are distributed on arcs starting from the outermost peripheral SBD. Therefore, if the space region 24 is formed on one of the arcs that is as inward as possible, the potential difference applied to the second well region 31 during reflux operations can be reduced to become smaller than the potential difference between the source and the drain. The potential difference applied to the second well region 31 can be reduced more as the space region 24 is positioned as close as possible to the outermost peripheral SBD.

Figure 4:
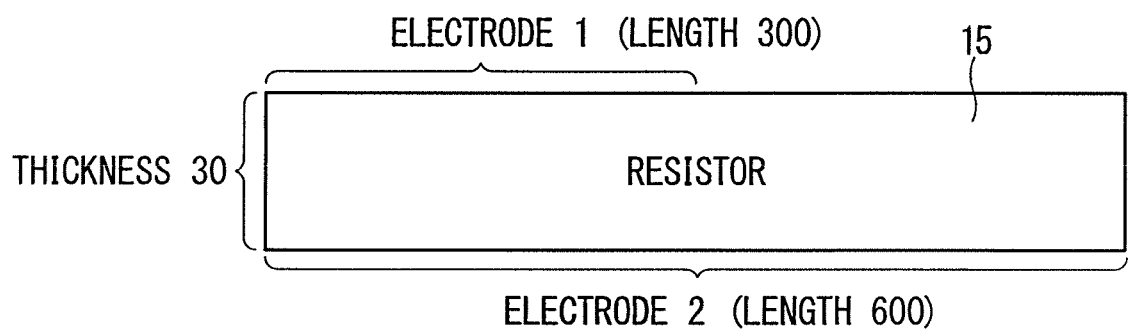
FIG. 4 is a diagram illustrating a resistor used for the simulation of a potential distribution in a drift layer of the SiC-MOSFET during reflux operations.

Next, the degree to which the potential difference to be applied to the second well region 31 is reduced in accordance with the positions of the space region 24 and the outermost peripheral SBD will be described more specifically. FIG. 4 is an illustration of a resistor 15 that simulates the drift layer 20. The resistor 15 includes an electrode 1 formed on part of the front side and an electrode 2 formed on the back side. The thickness of the resistor 15 is small enough as compared with the lengths of the electrodes 1 and 2. If the length of the electrode 1 is 300 and the length of the electrode 2 is 600, for example, the length of the resistor 15 is 50. This resistor 15 serves as a good approximation of the SiC-MOSFET 101 with respect to the current and potential distributions caused on the outer side of the outermost peripheral SBD by the passage of reflux current through the drift layer 20. The current and potential distributions in the resistor 15 illustrated in FIG. 4 were obtained by T-CAD simulation.

Figure 5:
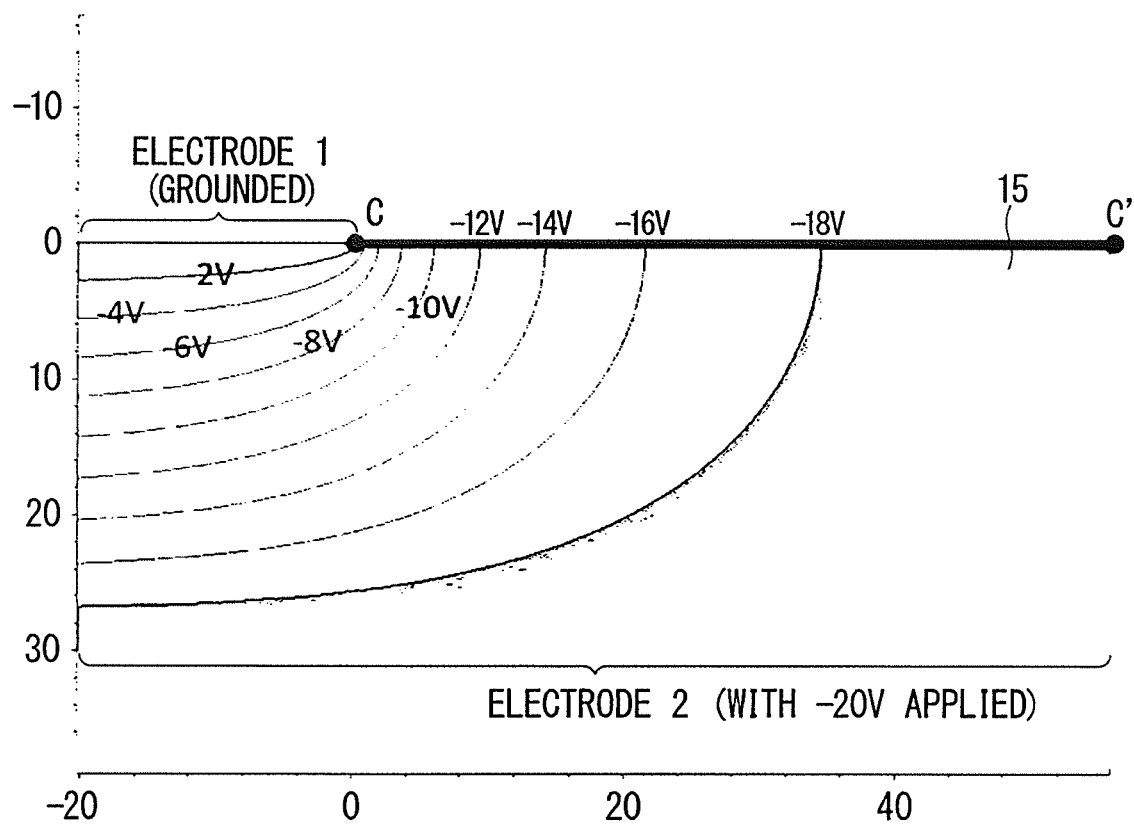
FIG. 5 is a diagram illustrating T-CAD simulation results on the potential distribution in the drift layer of the SiC-MOSFET during reflux operations.

FIG. 5 is an illustration of the potential distribution in the resistor 15 when the electrode 1 is grounded and the electrode 2 is applied with −20V so as to obtain a potential difference of 20V between these electrodes. The electrodes 1 and 2 correspond respectively to the source electrode 80 and the drain electrode 84 in the SiC-MOSFET 101. As illustrated in FIG. 5, equipotential lines are distributed on arcs from an end point C of the electrode 1, which corresponds to the outermost peripheral SBD of the SiC-MOSFET 101, toward a terminal point C'. On a line C-C', a voltage drop occurs in accordance with the distance from the point C.

Figure 6:
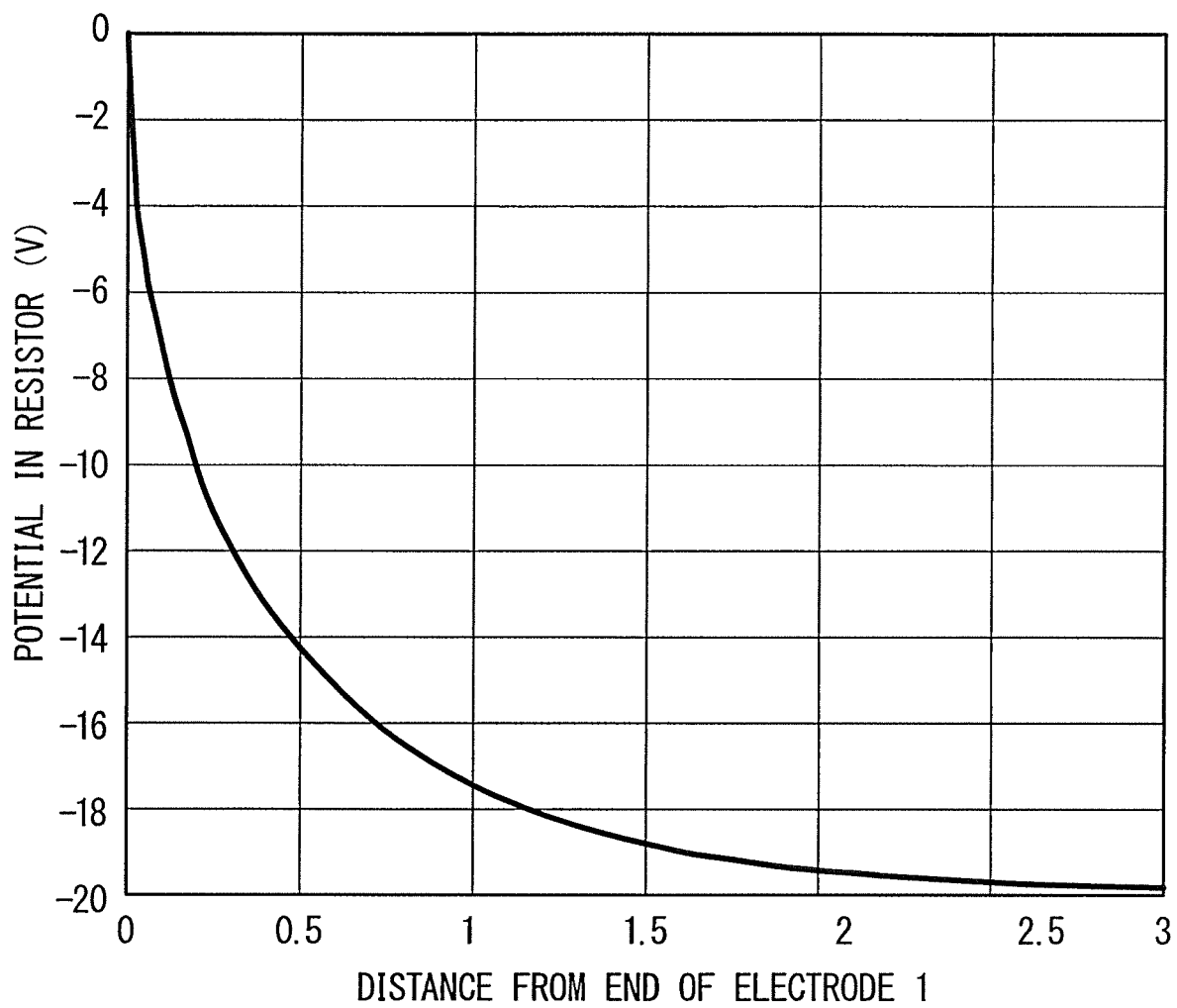
FIG. 6 is a diagram illustrating a potential distribution on a line C-C' in FIG. 5.

FIG. 6 is an illustration of the potential distribution on the line C-C'. The horizontal axis in FIG. 6 indicates the distance from the point C, which is standardized by the thickness of the resistor 15. It can be seen from FIG. 6 that, in the surface of the resistor 15, the voltage drop from the end point C of the electrode 1 becomes 10% or more smaller than the potential difference between the electrodes 1 and 2 when the distance from the end point C of the electrode 1 is less than or equal to 1.15 times the thickness of the resistor 15. Similarly, in the surface of the resistor 15, the voltage drop from the end point C of the electrode 1 becomes 30% or more smaller than the potential difference between the electrodes 1 and 2 when the distance from the end point C of the electrode 1 is less than or equal to 0.47 times the thickness of the resistor 15, and becomes 50% or more smaller when the distance from the end point C of the electrode 1 is less than or equal to 0.20 times the thickness of the resistor 15.

This results indicates that, in the SiC-MOSFET 101, if the distance between the space region 24 and the outermost peripheral SBD is set to fall within a range of 1.15 times the thickness of the drift layer 20, the potential difference to be applied to the second well region 31 can be reduced by 10% or more from the potential difference between the source electrode 80 and the drain electrode 84, and consistent effects can be obtained. Similarly, if the distance between the space region 24 and the outermost peripheral SBD is set to fall within 0.47 times the thickness of the drift layer 20, the potential difference to be applied to the second well region 31 can be reduced by 30% or more from the potential difference between the source electrode 80 and the drain electrode 84, and more consistent effects can be obtained. Furthermore, if the distance between the space region 24 and the outermost peripheral SBD is set to fall within 0.20 times the thickness of the drift layer 20, the potential difference to be applied to the second well region 31 can be reduced by 50% or more from the potential difference between the source electrode 80 and the drain electrode 84, and especially splendid effects can be obtained.

Next, as other steady states, ON- and OFF-states of the SiC-MOSFET 101 will be described. As in the case of typical FETs, the application of a positive voltage exceeding a threshold voltage to the gate electrode 60 causes a rise in potential at the surfaces of the first well regions 30, which oppose the gate electrode 60. Accordingly, the conduction band at the surface of the silicon carbide semiconductor approaches the Fermi level. At this time, electrons are supplied from the source electrode 40, and an inversion layer is formed in the surfaces of the first well regions 30. Since this inversion layer is connected at a low resistance to the source region 40 and the drift layer 20, the electrical resistance between the source electrode 80 and the drain electrode 84 becomes low, and the SiC-MOSFET is turned on.

When a voltage less than or equal to the threshold value is applied to the gate electrode 60, the resistance between the source electrode 80 and the drain electrode 84 becomes high because the inversion layer is not formed in the surfaces of the first well regions 30. Moreover, a reverse bias is applied to the pn junction configured by the drift layer 20 and the first, second, and third well regions 30, 31, and 32 due to an OFF-state voltage applied to the drain electrode 84, and a depletion layer expands mainly toward the drift layer 20 having a low impurity concentration. Accordingly, the resistance between the source electrode 80 and the drain electrode 84 becomes high and can hold a high withstand voltage, and the SiC-MOSFET is turned off.

Next, a turn-off operation will be described. During a turn-off operation, the potential at the drain electrode 84 rises abruptly. Then, a reverse bias is applied to the pn junction formed between the drift layer 20 and the second and third well regions 31 and 32, and a depletion layer expands from the interface of the pn junction to both sides of the drift layer 20 and the second and third well regions 31 and 32. At this time, the expansion of the depletion layer increases hole densities in non-depleted regions of the second and third well regions 31 and 32. This produces the flow of displacement current from the second and third well regions 31 and 32 via the first and second non-ohmic contact regions 76 and 77 toward the source electrode 80. The first and second non-ohmic contact regions 76 and 77 have non-ohmic connection with the source electrode 80. Specifically, the first and second non-ohmic contact regions 76 and 77 are isolated from or have Schottky connection with the source electrode 80.

When the source electrode 80 has Schottky connection with the second well region 31 in the first non-ohmic contact region 76 and has Schottky connection with the third well region 32 in the second non-ohmic contact region 77, a forward current flows from the second well region 31 or the third well region 32 toward the source electrode 80. Therefore, a high voltage that will cause a breakdown in the insulation film on the second or third well region 31 or 32 is not generated.

Even in the case where the source electrode 80 is isolated from the second well region 31 or the third well region 32 by, for example, a thin insulation film in the first non-ohmic contact region 76 or the second non-ohmic contact region 77, if the insulation film is thin, a breakdown in the insulation film occurs when the source-drain voltage becomes a fixed value or more. Therefore, a high voltage that causes a breakdown in the insulation film on the second or third well region 31 or 32 is not generated.

At this time, the source electrode 80 and the second or third well region 31 or 32 are spatially closely adjacent to each other in the first or second non-ohmic contact region 76 or 77. Accordingly, the parasitic capacitance in the contact portion increases considerably, and the passage of displacement current from the second or third well region 31 or 32 via this large parasitic capacitance to the source electrode 80 is allowed with a small voltage drop.

In the case where the space regions 23 and 24 form a pnp slit that yields with a fixed voltage, a high voltage that causes a breakdown in the insulation film on the second and third well regions 31 and 32 is reduced. For example, if the punch-through voltage V expressed by Expression 2 is designed to become less than or equal to 50V, the voltage to be generated in the second well region 31 can be reduced to 50V or less and the voltage to be generated in the third well region 32 can be reduced to 100V or less.

Next, turn-on characteristics will be described. During a turn-on operation, the drain voltage drops abruptly. At this time, the depletion layer formed between the drift layer 20 and the second and third well regions 31 and 32 in the OFF-state shrinks abruptly. Accordingly, the depletion layer formed form the source electrode 80 to between the second and third well regions 31 and 32 shrinks abruptly. Therefore, a displacement current flows from the source electrode 80 into the second and third well regions 31 and 32.

In the case where the source electrode 80 has Schottky connection with the second well region 31 in the first non-ohmic contact region 76 and has Schottky connection with the third well region 32 in the second non-ohmic contact region 77, the flow of current during the turn-on operation reverses from the forward direction of SBDs formed between the source electrode 80 and the second or third well region 31 or 32. However, if the SBDs are designed to yield with a fixed reverse voltage, the voltage to be generated in the second or third well region 31 or 32 can be reduced to such a voltage or less that causes a breakdown in the insulation film formed on these well regions.

The same applies in the case where the source electrode 80 is isolated from the second or third well region 31 or 32. If design is made such that, with a voltage less than or equal to a fixed value, a dielectric breakdown occurs and the passage of current is allowed between the source electrode 80 and the second or third well region 31 or 32, the voltage to be generated in the second or third well region 31 or 32 can be reduced to such a voltage or less that causes a breakdown in the insulation film formed on these well regions.

The source electrode 80 and the second or third well region 31 or 32 are spatially closely adjacent to each other in the first or second non-ohmic contact region 76 or 77. Accordingly, the parasitic capacitance in the contact portion increases considerably, and the passage of transient current via this large parasitic capacitance enables the passage of displacement current from the second or third well region 31 or 32 to the source electrode 80, with a small voltage drop. The voltage to be generated in the second or third well region 31 or 32 can be reduced enough to such a voltage or less that causes a breakdown in the insulation film formed on these well regions.

As in the case of turn-off operations, when the space regions 23 and 24 form a pnp slit that yields with a fixed voltage, a high voltage that causes a breakdown in the insulation film on the second or third well region 31 or 23 can be reduced. For example, if the punch-through voltage V expressed by Expression 2 is designed to become less than or equal to 50V, the voltage to be generated in the second well region 31 can be reduced to 50V or less, and the voltage to be generated in the third well region 32 can be reduced to 100V or less.

A-4. Variations

Figure 7:
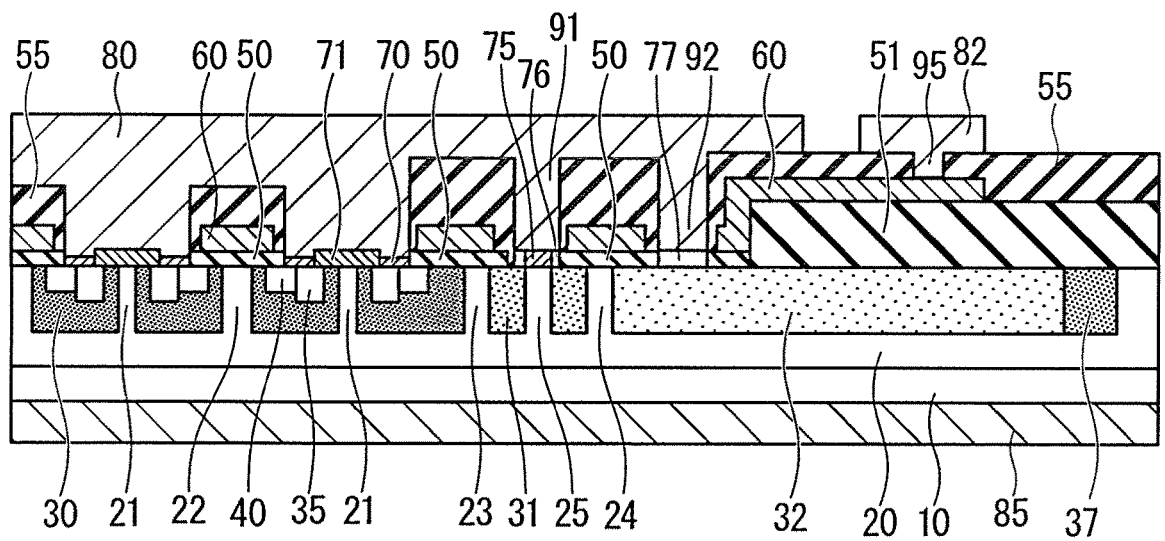
FIG. 7 is a sectional view of an SiC-MOSFET according to a variation of Embodiment 1, taken along the line a-a' in FIG. 1.

FIG. 7 is a sectional view of an SiC-MOSFET 101A according to a variation of Embodiment 1, taken along the line a-a' in FIG. 1. The SiC-MOSFET 101A includes a space region 25 that penetrates the second well region 31 in the thickness direction. The space region 25 is composed of n-type silicon carbide of the same type as that of the drift layer 20. The n-type impurity concentration in the space region 25 may be the same as the n-type impurity concentration in the drift layer 20, or may be higher or lower than the n-type impurity concentration in the drift layer 20. The space region 25 is also referred to as a fourth space region.

On the upper surface of the space region 25, an outer peripheral Schottky electrode 75 is formed in Schottky connection with the space region 25. The space region 25 establishes contact with the source electrode 80 via the outer peripheral Schottky electrode 75. Accordingly, an SBD is formed in the outer peripheral region of the SiC-MOSFET 101A. With this configuration, it is possible to suppress a voltage drop in the outer peripheral region during reflux operations and to further suppress the passage of bipolar current from the second well region 31, the third well region 32, and the first well regions 30 that are adjacent to the second well region 31.

B. Embodiment 2

B-1. Configuration

Figure 8:
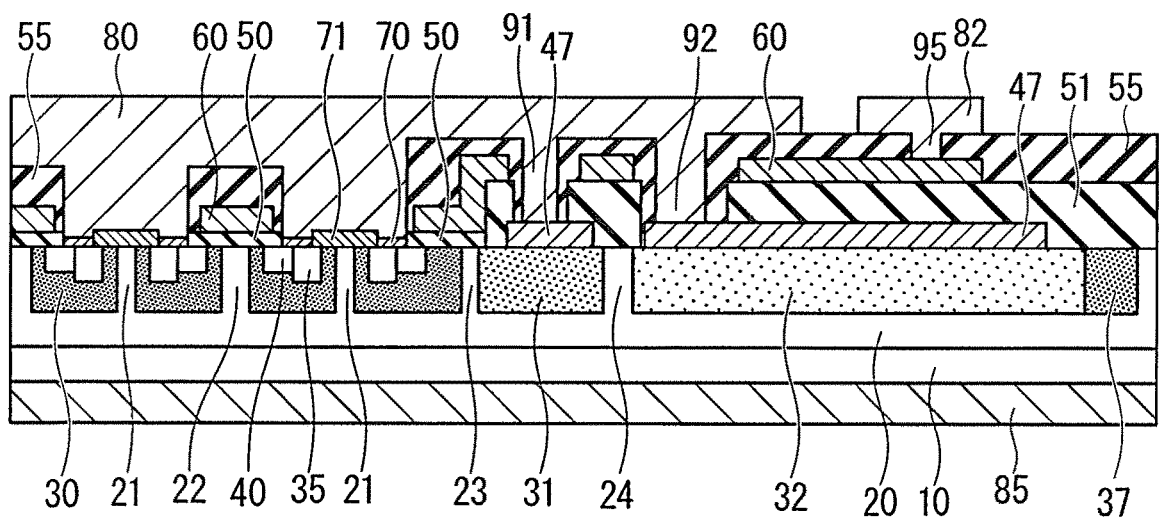
FIG. 8 is a sectional view of an SiC-MOSFET according to Embodiment 2, taken along the line a-a' in FIG. 1.

FIG. 8 is a sectional view of an SiC-MOSFET 102 that includes SBDs, each serving as a silicon carbide semiconductor device according to Embodiment 2, taken along the line a-a' in FIG. 1. The SiC-MOSFET 102 differs from the SiC-MOSFET 101 according to Embodiment 1 in that a conductive layer 47 is provided on the second well region 31 and the third well region 32. The conductive layer 47 does not have ohmic connection with the second well region 31, but has ohmic connection with the source electrode 80 via the second-well-region contact hole 91 and the third-well-region contact hole 92.

The source electrode 80 does not have ohmic connection with the second well region 31 and the third well region 32. However, the second well region 31 and the third well region 32 are in contact with the conductive layer 47, and the conductive layer 47 has ohmic connection with the source electrode 80. Therefore, the conductive layer 47, the second well region 31, and the third well region 32 are connected to one another via high connection capacitances composed primarily of the capacitance of a depletion layer.

In the SiC-MOSFET 102, the high connection capacitances between the conductive layer 47 and the second and third well regions 31 and 32 allow the passage of displacement current generated from the second and third well regions 31 and 32 to the conductive layer 47 with a voltage generated during turn-on and turn-off operations. By reducing the sheet resistance of the conductive layer 47, the voltage to be generated in the current path from the second or third well region 31 or 32 to the source electrode 80 can be suppressed to a low level. As a result, the SiC-MOSFET 102 can prevent a breakage from occurring in the insulation film on the conductive layer 47 and +the second and third well regions 31 and 32 due to the passage of displacement current during switching and can significantly improve its reliability while maintaining a high ability to suppress the passage of bipolar current during reflux operations by the introduction of the space region 24.

In FIG. 8, the conductive layer 47 is formed on the second and third well regions 31 and 32, but the conductive layer 47 may be formed on only one of the second and third well regions 31 and 32. In that case, it is preferable that the contact between the source electrode 80 and the well region on which the conductive layer 47 is not formed is established in the same manner as in the first non-ohmic contact region 76 or the second non-ohmic contact region 77 according to Embodiment 1.

B-2. Manufacturing Method

The SiC-MOSFET 102 can be basically manufactured by the same process as the process of manufacturing the SiC-MOSFET 101 according to Embodiment 1. In the case where the conductive layer 47 is composed of highly doped polysilicon, the step of forming polysilicon on the outer peripheral region of the chip and patterning the polysilicon may be simply added before the formation of the field insulating film 51. The conductive layer may be composed of metal such as Al, Ti, or Ni, or may be composed of semimetal such as graphite.

B-3. Variation

Figure 9:
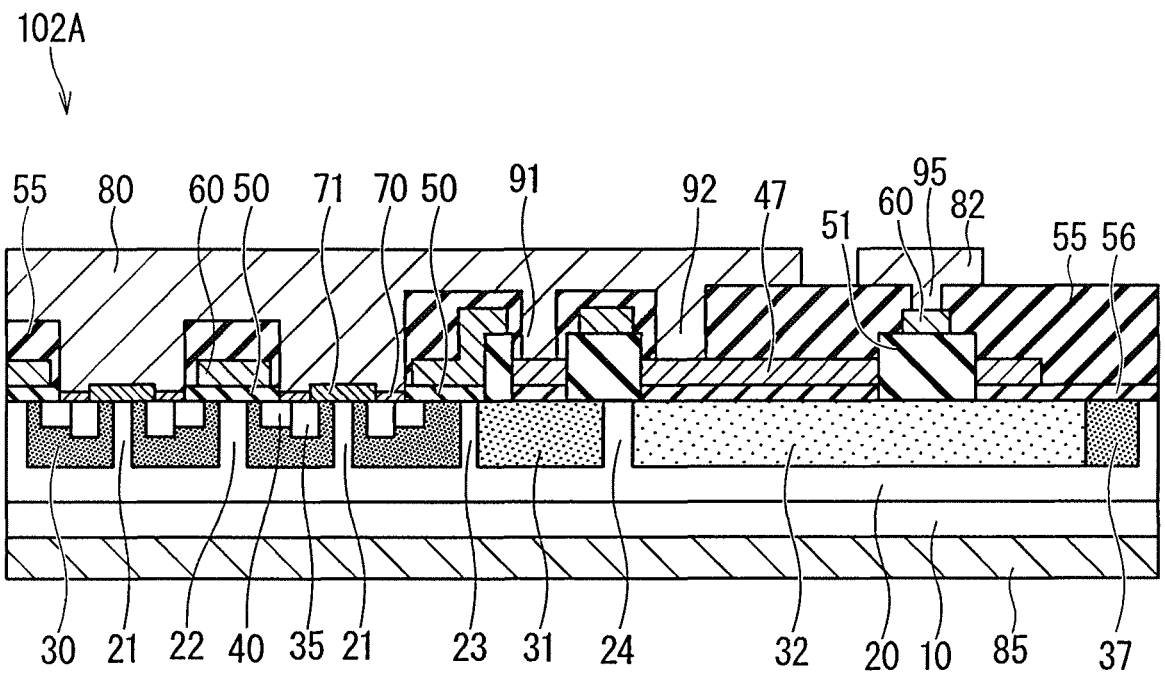
FIG. 9 is a sectional view of an SiC-MOSFET according to a variation of Embodiment 2, taken along the line a-a' in FIG. 1.

FIG. 9 is a sectional view of an SiC-MOSFET 102A according to a variation of Embodiment 2, taken along the line a-a' in FIG. 1. The SiC-MOSFET 102A is similar to the SiC-MOSFET 102, except that a thin insulation film 56 is provided between the conductive layer 47 and the second and third well regions 31 and 32.

In the SiC-MOSFET 102, the conductive layer 47 is in contact with the surfaces of the second and third well regions 31 and 32. The effect of Embodiment 2, however, can be obtained as long as large capacitance components are present between the conductive layer 47 and the second and third well regions 31 and 32. Thus, the insulation film 56 may be provided between the conductive layer 47 and the second and third well regions 31 and 32 as in the SiC-MOSFET 102A.

The conductive layer 47 can be formed by the same step as the gate line. This reduces the number of masks required.

C. Embodiment 3

C-1. Configuration

Figure 10:
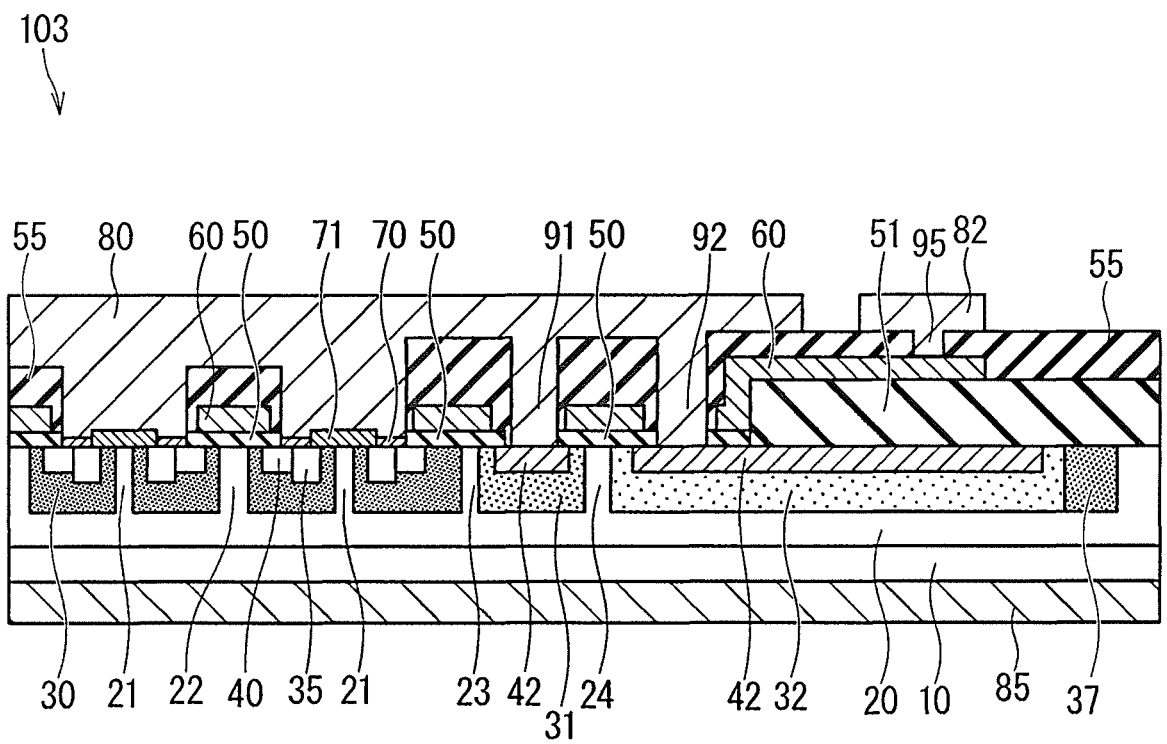
FIG. 10 is a sectional view of an SiC-MOSFET according to Embodiment 3, taken along the line a-a' in FIG. 1.

FIG. 10 is a sectional view of an SiC-MOSFET 103 that includes SBDs, each serving as a silicon carbide semiconductor device according to Embodiment 3, taken along the line a-a' in FIG. 1. The SiC-MOSFET 103 is configured such that the conductive layer 47 in the SiC-MOSFET 102 according to Embodiment 2 is replaced by a silicon carbide conductive layer 42 of the first conductivity type. The silicon carbide conductive layer 42 is formed in the surface layers of the second and third well regions 31 and 32.

The impurity concentration in the silicon carbide conductive layer 42 is higher than the impurity concentration in the drift layer 20 and is, for example, of the order of $1 \times 10^{18}$ to $1 \times 10^{20}$ cm$^{-3}$. The silicon carbide conductive layer 42 is a semiconductor of the first conductivity type with a high concentration and therefore has ohmic connection with the source electrode 80 via the second-well-region contact hole 91 and the third-well-region contact hole 92.

C-2. Operations

The silicon carbide conductive layer 42 has functions similar to those of the conductive layer 47. First, the silicon carbide conductive layer 42 forms pn diodes with the second and third well regions 31 and 32. Thus, almost no current flows from the silicon carbide conductive layer 42 to the second and third well regions 31 and 32 during reflux operations because this flow of current corresponds to reverse passage of current through the diodes. Accordingly, the passage of bipolar current in the outer peripheral region can be considerably suppressed during reflux operations.

Besides, even if a large negative voltage is applied to the drain electrode 84, the presence of the space region 24 minimizes the negative voltage applied to the second well region 31. Therefore, the passage of bipolar current can be suppressed as in Embodiments 1 and 2 even with the application of a larger negative drain voltage.

In the turn-off state, a displacement current generated along with an abrupt rise in drain voltage flows as a forward current to the source electrode 80 with a low generated voltage, the forward current flowing through the pn diodes formed by the second and third well regions 31 and 32 and the silicon carbide conductive layer 42. Thus, a large voltage that causes a breakage in the insulation film on the second and third well regions 31 and 32 will not be generated. This realizes a silicon carbide semiconductor device with high reliability.

In the turn-on state, a displacement current generated along with an abrupt drop in the drain voltage flows as a reverse current through the pn diodes formed by the silicon carbide conductive layer 42 and the second and third well regions 31 and 32. However, the pn diodes are formed in the vicinity of the surface of the drift layer 20 and composed of the second and third well regions 31 and 32 and the silicon carbide conductive layer 42, all having high impurity concentrations. Therefore, the capacitance of the depletion layer in the pn diodes is very large during the application of reverse bias. This allows the passage of displacement current via the capacitance of the depletion layer. Accordingly, a high voltage that causes a breakdown in the insulation film will not be generated in the second and third well regions 31 and 32. This realizes a silicon carbide semiconductor device with high reliability.

C-3. Manufacturing Method

In the process of manufacturing the SiC-MOSFET 101 according to Embodiment 1, the silicon carbide conductive layer 42 may be formed by implanting ions such as nitrogen or phosphorus simultaneously with or after the step of forming the source region 40 and the contact region 35 by ion implantation. Alternatively, the silicon carbide conductive layer 42 may be formed on the second and third well regions 31 and 32 by epitaxial growth using CVD.

In FIG. 10, the silicon carbide conductive layer 42 is formed inside of the second and third well regions 31 and 32, but the silicon carbide conductive layer 42 may be formed only inside of one of the second and third well regions 31 and 32. For example, the silicon carbide conductive layer 42 may be formed only inside of the third well region 32 to which a larger voltage is applied during reflux operations. Accordingly, the passage of bipolar current can be suppressed with a higher voltage during reflux operations. As another alternative, the silicon carbide conductive layer 42 does not necessary have to have the same impurity concentration in the second and third well regions 31 and 32, and may have different impurity concentrations in the second and third well regions 31 and 32.

D. Embodiment 4

D-1. Configuration

Figure 11:
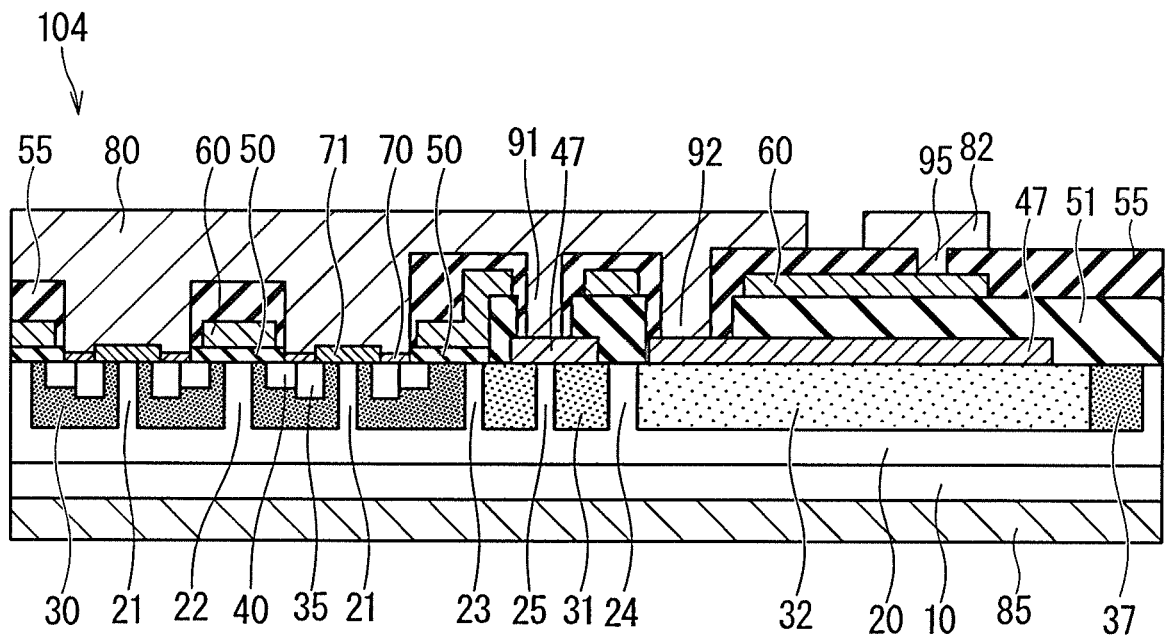
FIG. 11 is a sectional view of an SiC-MOSFET according to Embodiment 4, taken along the line a-a' in FIG. 1.

FIG. 11 is a sectional view of an SiC-MOSFET 104 that includes SBDs, each serving as a silicon carbide semiconductor device according to Embodiment 4, taken along the line a-a' in FIG. 1. The SiC-MOSFET 104 is configured such that a space region 25 penetrating the second well region 31 in the thickness direction is provided in the SiC-MOSFET 102 according to Embodiment 2. The space region 25 is composed of n-type silicon carbide of the same type as that of the drift layer 20. The n-type impurity concentration in the space region 25 may be the same as the n-type impurity concentration in the drift layer 20, or may be higher or lower than the n-type impurity concentration in the drift layer 20.

On the upper surface of the space region 25, a conductive layer 47 is formed. The conductive layer 47 that has ohmic connection with the source electrode 80 has Schottky connection with the space region 25. Accordingly, an SBD is also formed in the second well region 31.

The presence of the SBD in the second well region 31 suppresses a voltage drop in the outer peripheral region during reflux operations. Thus, even if the space region 24 is located away from the outermost peripheral SBD, the voltage to be applied to the space region 24 can be kept high. This reduces the potential difference applied to the second well region 31, the conductive layer 47, the first well region 30, and the pnp slit including the space region 23, thereby suppressing a breakdown operation and further suppressing the passage of bipolar current during reflux operations. The turn-on and turn-off operations of the SiC-MOSFET 104 are the same as those of the SiC-MOSFET 102 according to Embodiment 2. The method of manufacturing the SiC-MOSFET 104 is also almost the same as the method of manufacturing the SiC-MOSFET 102.

D-2. Variations

Figure 12:
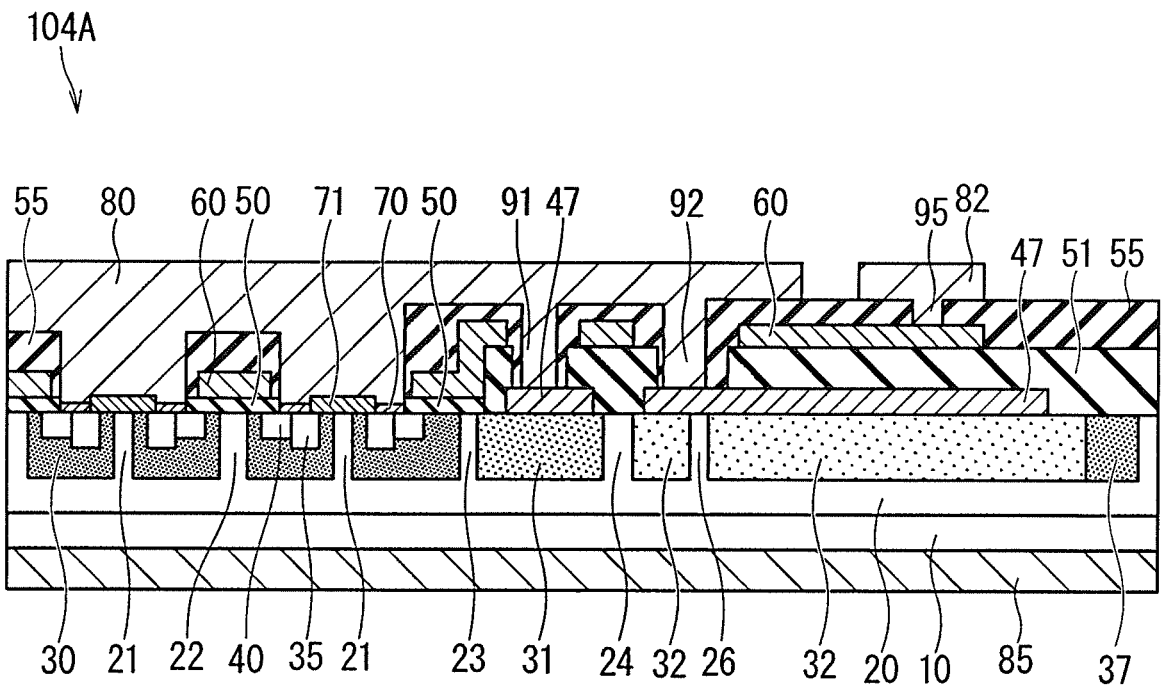
FIG. 12 is a sectional view of an SiC-MOSFET according to a first variation of Embodiment 4, taken along the line a-a' in FIG. 1.

FIG. 12 is a sectional view of an SiC-MOSFET 104A that includes SBDs, each serving as a silicon carbide semiconductor device according to a first variation of Embodiment 4, taken along the line a-a' in FIG. 1. The SiC-MOSFET 104A is configured such that a space region 26 is provided, instead of the space region 25, in the configuration of the SiC-MOSFET 104. The space region 26 penetrates the third well region 32 in the thickness direction. The space region 26 is composed of n-type silicon carbide of the same type as that of the drift layer 20. The n-type impurity concentration in the space region 26 may be the same as the n-type impurity concentration in the drift layer 20, or may be higher or lower than the n-type impurity concentration in the drift layer 20. The conductive layer 47 and the space region 26 form an SBD. This makes it possible to reduce the potentials around the space region 24 and the second well region 31. Accordingly, even if a large negative voltage is applied to the drain during reflux operations, it is possible to reduce the voltage to be applied between the second well region 31 and the first well regions 30 and the voltage to be applied between the second well region 31 and the conductive layer 47 and to suppress the passage of bipolar current.

Figure 13:
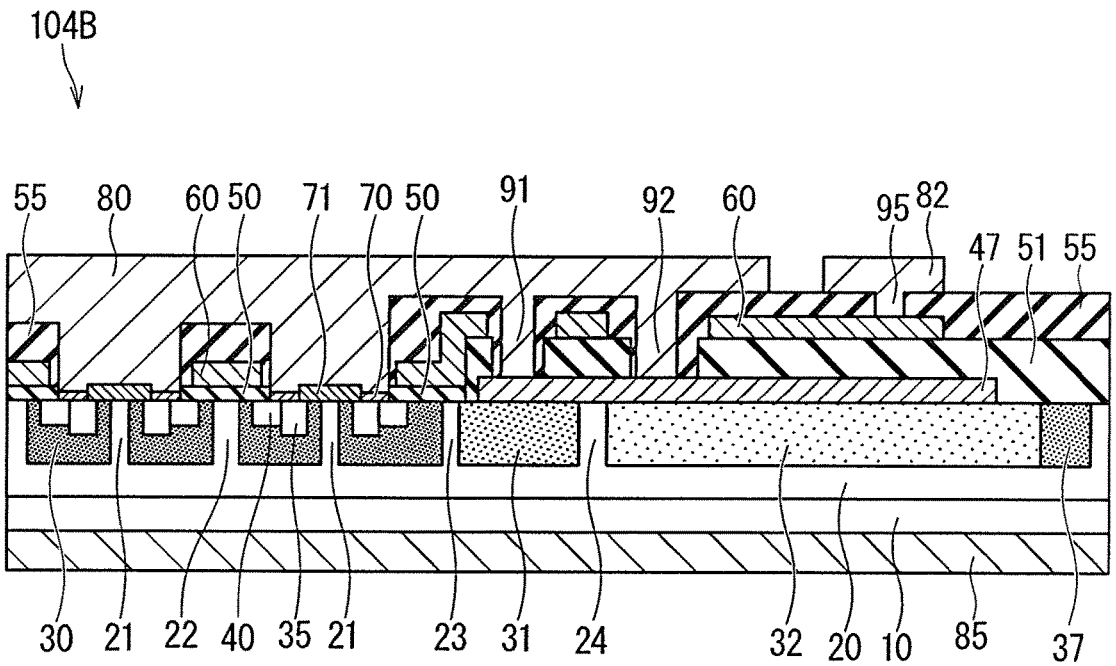
FIG. 13 is a sectional view of an SiC-MOSFET according to a second variation of Embodiment 4, taken along the line a-a' in FIG. 1.

FIG. 13 is a sectional view of an SiC-MOSFET 104B that includes SBDs, each serving as a silicon carbide semiconductor device according to a second variation of Embodiment 4, taken along the line a-a' in FIG. 1. The SiC-MOSFET 104B is configured such that the conductive layer 47 is formed astride the space region 24 in the SiC-MOSFET 102 according to Embodiment 2. Accordingly, the space region 24 and the conductive layer 47 form an SBD. This makes it possible to reduce a potential drop in the second well region 31 during reflux operations. That is, when a large negative voltage is applied to the drain during reflux operations, the passage of bipolar current can be further suppressed because the passage of current caused by punch-through occurring in the first and second well regions 30 and 31 is suppressed. This further improves reliability.

The above embodiments have described the SiC-MOSFETs including SBDs, in which the active region includes the space region 21, and the space region 21 is connected to the source electrode 80 via the Schottky electrode 71 formed on the space region 21. However, the SiC-MOSFETs do not necessarily have to include SBDs, and may include diodes that operate in a unipolar manner, i.e., unipolar diodes, when a reverse voltage is applied to the MOSFETs. For example, an SiC-MOSFET that includes a reverse conducting diode structure as described in PTL 4 also has problems similar to those of the SiC-MOSFET including SBDs in the outer peripheral region of the element, and therefore can benefit from the effects of each of the above-described embodiments by applying thereto the configuration of the embodiment.

Figure 14:
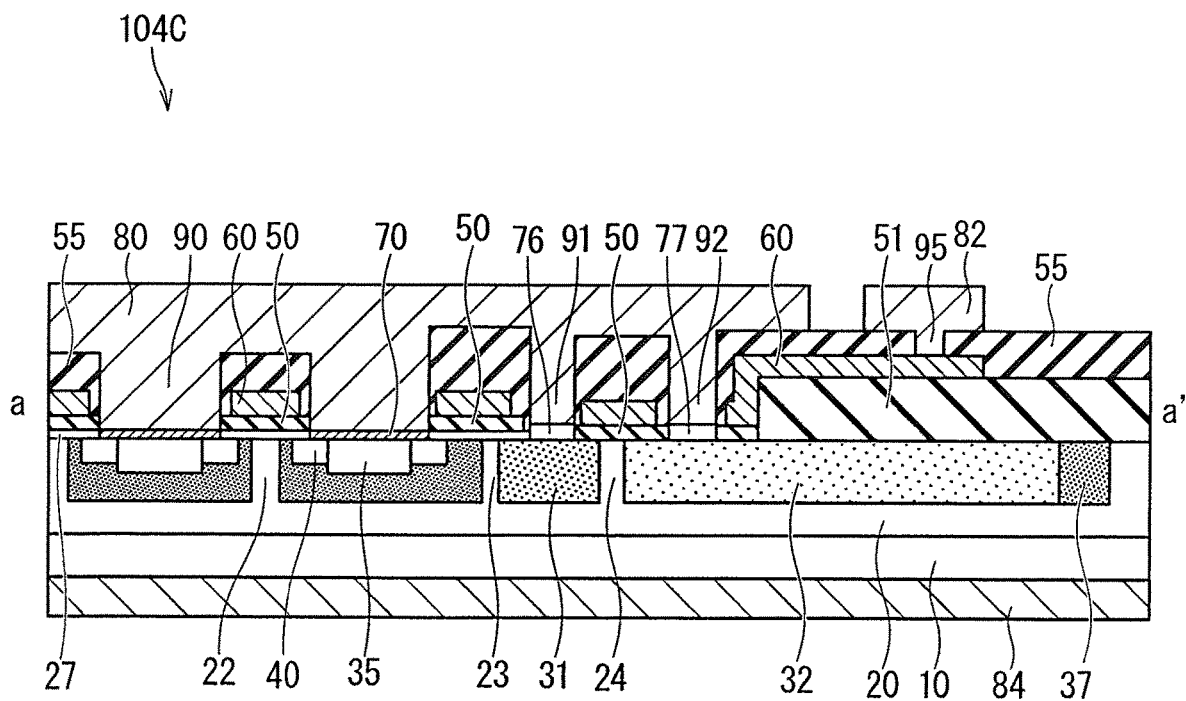
FIG. 14 is a sectional view of an SiC-MOSFET according to a third variation of Embodiment 4, taken along the line a-a' in FIG. 1.

A specific example is as illustrated in FIG. 14. FIG. 14 is a sectional view of an SiC-MOSFET 104C that has a reverse conducting diode structure serving as a silicon carbide semiconductor device according to a third variation of Embodiment 4, taken along the line a-a' in FIG. 1. The SiC-MOSFET 104C is configured such that a channel epitaxial layer 27 of the first conductivity type is provided, instead of SBDs, in the active region of the SiC-MOSFET 101 according to Embodiment 1. The channel epitaxial layer 27 is formed on the surfaces of the first well regions 30 in which the source regions 40 are not formed, and has a lower impurity concentration of the first conductivity type than the source region 40. The source electrode 80 is connected to the channel epitaxial layer 27. That is, the SiC-MOSFET 104C includes reverse conducting unipolar diodes in the active region. This structure allows the passage of unipolar current from the channel portions during backward operations and thereby suppresses the passage of bipolar current from the first well regions 30. The semiconductor device with such an active region can also benefit from the effects of each of the above-described embodiments by applying thereto the configuration of the embodiment.

In the SiC-MOSFET 104C, if the distance from the channel epitaxial layer 27 formed on the surface of the outermost peripheral first well region 30 to the space region 24 referred to as the third space region is shorter than 1.15 times the thickness of the drift layer 20, the potential difference to be applied to the second well region 31 can be reduced by 10% or more from the potential difference between the source electrode 80 and the drain electrode 84.

The SiC-MOSFET described in each of the above embodiments includes planar MOSFETs in the active region. However, the scope of the effects of each embodiment is not limited to planar MOSFETs. For example, the configurations of the above-described embodiments are also applicable to trench MOSFETs formed by being carved into the surface of a silicon carbide substrate of a gate structure, and the trench MOSFETs can also benefit from the effects of each of the above-described embodiments by applying thereto the configuration of the embodiment.

In the SiC-MOSFET described in each of the above embodiments, the outer peripheral structure is flat, but the outer peripheral structure may be carved in the depth direction by, for example, the step of forming trenches in a trench MOSFET.

E. Embodiment 5

The present embodiment describes a case in which the silicon carbide semiconductor device according to any one of Embodiments 1 to 4 described above is applied to a power converter. The present invention is not limited to a specific power converter, but the following description is given of the case as Embodiment 5 in which the silicon carbide semiconductor device according to any one of Embodiments 1 to 4 is applied to a three-phase inverter.

Figure 15:
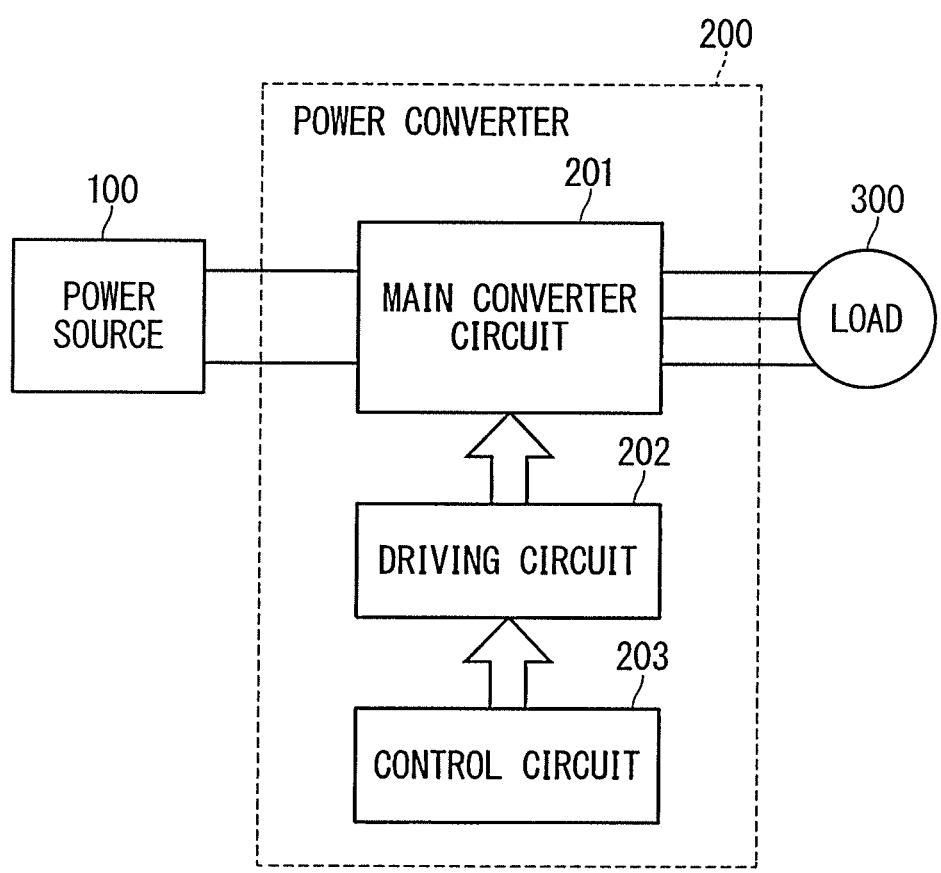
FIG. 15 is a block diagram of a configuration of a power conversion system.

FIG. 15 is a block diagram illustrating a configuration of a power conversion system that adopts the power converter according to the present embodiment.

The power conversion system illustrated in FIG. 15 is configured to include a power source 100, a power converter 200, and a load 300. The power source 100 is a direct-current power supply and supplies direct-current power to the power converter 200. The power source 100 may be configured by various devices. For example, the power source 100 may be configured by a direct-current system, a solar cell, or a storage battery, or may be configured by a rectifier circuit or an AC/DC converter that is connected to an alternating-current system. As another alternative, the power source 100 may be configured by a DC/DC converter that converts direct-current power output from a direct-current system into predetermined electric power.

The power converter 200 is a three-phase inverter connected between the power source 100 and the load 300. The power converter 200 converts direct-current power supplied from the power source 100 into alternating-current power and supplies the alternating-current power to the load 300. As illustrated in FIG. 15, the power converter 200 includes a main converter circuit 201, a driving circuit 202, and a control circuit 203. The main converter circuit 201 converts direct-current power into alternating-current power and outputs the alternating-current power. The driving circuit 202 outputs a drive signal for driving each switching element in the main converter circuit 201. The control circuit 203 outputs a control signal for controlling the driving circuit 202 to the driving circuit 202.

The driving circuit 202 performs off control of each normally off switching element by making the voltage at the gate electrode and the voltage at the source electrode to be at the same potential.

The load 300 is a three-phase electric motor driven by the alternating-current power supplied from the power converter 200. The load 300 is not limited to use in specific applications, and may be used as an electric motor mounted on any of various electrical apparatuses. For example, the load 300 may be used as an electric motor for a hybrid automobile, an electric automobile, a railway vehicle, an elevator, or an air conditioner.

The detail of the power converter 200 will be described hereinafter. The main converter circuit 201 includes switching elements and freewheeling diodes (not shown) and is configured to convert direct-current power supplied from the power source 100 into alternating-current power and supply the alternating-current power to the load 300 by switching each switching element. A specific circuit configuration of the main converter circuit 201 may be any of various circuit configurations, and the main converter circuit 201 according to the present embodiment is a two-level three-phase full bridge circuit configured by six switching elements and six freewheeling diodes that are respectively arranged in inverse-parallel with the six switching elements. The silicon carbide semiconductor device according to any one of Embodiments 1 to 4 described above is applied to each switching element of the main converter circuit 201. Each two of the six switching elements are connected in series and configure upper and lower arms, and each pair of upper and lower arms configures each phase (U phase, V phase, W phase) of the full bridge circuit. The output terminals of the pairs of upper and lower arms, i.e., three output terminals of the main converter circuit 201, are connected to the load 300.

The driving circuit 202 generates drive signals for driving the switching elements in the main converter circuit 201 and supplies the drive signals to the control electrodes of the switching elements in the main converter circuit 201. Specifically, the driving circuit 202 outputs, to the control electrode of each switching element, a drive signal for turning the switching element on or a drive signal for turning the switching element off, in accordance with the control signal received from the control circuit 203, which will be described later. When a switching element is maintained in the ON-state, the driving signal is a voltage signal (turn-on signal) higher than or equal to the threshold voltage of the switching element, and when a switching element is maintained in the OFF-state, the driving signal is a voltage signal (turn-off signal) lower than or equal to the threshold voltage of the switching element.

The control circuit 203 controls the switching elements in the main converter circuit 201 so that desired electric power is supplied to the load 300. Specifically, the time (turn-on time) to turn on each switching element in the main converter circuit 201 is calculated based on the electric power to be supplied to the load 300. For example, the main converter circuit 201 can be controlled by PWM control in which the turn-on time of each switching element is modulated in accordance with the voltage to be output. Then, a control command (control signal) is output to the driving circuit 202 so that the turn-on signal is output to each switching element to be turned on at each point in time, and the turn-off signal is output to each switching element to be turned off at each point in time. In accordance with this control signal, the driving circuit 202 outputs the turn-on or turn-off signal as a driving signal to the control electrode of each switching element.

The power converter according to the present embodiment adopts the silicon carbide semiconductor device according to any one of Embodiments 1 to 4 as each switching element of the main converter circuit 201. This achieves a power converter with low loss and improved reliability of high-speed switching.

The present embodiment has described an example in which the silicon carbide semiconductor device according to any one of Embodiments 1 to 4 is applied to a two-level three-phase inverter. However, the application of the silicon carbide semiconductor devices according to Embodiments 1 to 4 is not limited to this example, and each silicon carbide semiconductor device may be applied to any of various power converters. The present embodiment has described the two-level power converter as an example, but the silicon carbide semiconductor device according to any one of Embodiments 1 to 4 may be applied to a three-level converter or a multilevel power converter. In the case where electric power is supplied to a single phase load, the silicon carbide semiconductor device according to any one of Embodiments 1 to 4 may be applied to a single-phase inverter. In the case where electric power is supplied to, for example, a direct-current load, the silicon carbide semiconductor device according to any one of Embodiments 1 to 4 may be applied to a DC/DC converter or an AC/DC converter.

The power converter that adopts the silicon carbide semiconductor device according to any one of Embodiments 1 to 4 is not limited to use in the case where the aforementioned load is an electric motor. For example, the power converter may be used as an electric discharge machine, a laser processing machine, or an induction heating cooking appliance, may be used as a power supply device for a non-contact feed system, or may be used as a power conditioner for a system such as a photovoltaic power generating system or an electric condenser system.

It should be noted that the present invention can be implemented by freely combining the above embodiments or by making a modification or omission on the embodiments as appropriate without departing from the scope of the present invention. While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

15: resistor, 20: drift layer, 21-26: space region, 30: first well region, 31: second well region, 32: third well region, 25: contact region, 27: channel epitaxial layer, 37: JTE region, 40: source region, 42: silicon carbide conductive layer, 47: conductive layer, 50: gate insulating film, 51: field insulating film, 55: interlayer insulation film, 56: insulation film, 60: gate electrode, 70: ohmic electrode, 71: Schottky electrode, 75: outer peripheral Schottky electrode, 76: first non-ohmic contact region, 77: second non-ohmic contact region, 80: source electrode, 81: gate pad, 82: gate line, 84: drain electrode, 90: first-well-region contact hole, 91: second-well-region contact hole, 95: gate contact hole, 100: power source, 200: power converter, 201: main converter circuit, 202: driving circuit, 203: control circuit, 300: load.

The invention claimed is:

1. A silicon carbide semiconductor device comprising:
   a semiconductor substrate composed of silicon carbide of a first conductivity type;
   a drift layer of the first conductivity type formed on the semiconductor substrate;
   a plurality of first well regions of a second conductivity type provided in a surface layer of the drift layer;
   a second well region of the second conductivity type provided in the surface layer of the drift layer, with a second space region of the first conductivity type sandwiched between the second well region and an outermost first region out of the plurality of first well regions;
   a third well region of the second conductivity type provided on a side of the second well region opposite to the plurality of first well regions in the surface layer of the drift layer, with a third space region of the first conductivity type sandwiched between the third well region and the second well region;
   a source region of the first conductivity type formed in surface layers of the plurality of first well regions;
   an ohmic electrode formed on the plurality of first well regions and having ohmic connection with the plurality of first well regions;
   a gate insulating film formed on the plurality of first well regions and the second well region;
   a field insulating film formed on the third well region;
   a gate electrode formed on the gate insulating film and the field insulating film; and
   a gate pad formed on the gate insulating film or the field insulating film,
   the silicon carbide semiconductor device further comprising:
   a unipolar diode provided in a unit cell including the plurality of first well regions; and
   a source electrode connected to the unipolar diode and the ohmic electrode and not having ohmic connection with the second well region and the third well region,
   the silicon carbide semiconductor device further comprising at least one of:
   a first space region of a first conductivity type penetrating each of the plurality of first well regions in a thickness direction; and
   a fourth space region of a first conductivity type penetrating the second well region in a thickness direction,
   wherein a distance from a Schottky electrode to the third space region is shorter than 1.15 times a film thickness of the drift layer, the Schottky electrode having Schottky connection with the first space region adjacent to the outermost first well region out of the plurality of first well regions or the fourth space region.

2. The silicon carbide semiconductor device according to claim 1,
   wherein the unipolar diode is a Schottky barrier diode including:
   the first space region; and
   the Schottky electrode formed on the first space region and having Schottky connection with the first space region, and
   the source electrode is connected to the Schottky electrode.

3. The silicon carbide semiconductor device according to claim 1, wherein
   a punch-through voltage V in the third space region, expressed by Expression 1 below, is lower than or equal to 50V:

$$V = \frac{qNW^2}{2\epsilon} \qquad \text{Expression 1}$$

where W is a width of the third space region in a direction of connection of the second well region and the third well region,
   N is an effective impurity concentration in the third space region,
   ε is a dielectric constant of a semiconductor configuring the third space region, and
   q is an elementary electric charge.

4. The silicon carbide semiconductor device according to claim 1, wherein
   the drift layer has an impurity concentration lower than or equal to $5 \times 10^{15}$ cm$^{-3}$.

5. The silicon carbide semiconductor device according to claim 1, wherein
   the second well region or the third well region has Schottky connection with the source electrode.

6. The silicon carbide semiconductor device according to claim 1, further comprising:
   a conductive layer having ohmic connection with the source electrode on the second well region or the third well region and not having ohmic connection with the second well region or the third well region.

7. The silicon carbide semiconductor device according to claim 6, wherein
   the conductive layer is composed of silicon carbide of the first conductivity type.

8. The silicon carbide semiconductor device according to claim 6,
   wherein the fourth space region has an upper surface having Schottky connection with the source electrode via the conductive layer.

9. The silicon carbide semiconductor device according to claim 6, wherein the conductive layer is composed of polysilicon having conductivity.

10. The silicon carbide semiconductor device according to claim 9, wherein
the polysilicon is formed on the second well region or the third well region via an insulation film.

11. A power converter comprising:
a main converter circuit that includes the silicon carbide semiconductor device according to claim 1 and converts and outputs input electric power;
a driving circuit that makes the silicon carbide semiconductor device perform a turn-off operation in which a voltage at the gate electrode of the silicon carbide semiconductor device and a voltage at the source electrode are made to be the same and outputs a drive signal for driving the silicon carbide semiconductor device to the silicon carbide semiconductor device; and
a control circuit that outputs a control signal for controlling the driving circuit to the driving circuit.

12. A silicon carbide semiconductor device comprising:
a semiconductor substrate composed of silicon carbide of a first conductivity type;
a drift layer of the first conductivity type formed on the semiconductor substrate;
a plurality of first well regions of a second conductivity type provided in a surface layer of the drift layer;
a second well region of the second conductivity type provided in the surface layer of the drift layer, with a second space region of the first conductivity type sandwiched between the second well region and an outermost first region out of the plurality of first well regions;
a third well region of the second conductivity type provided on a side of the second well region opposite to the plurality of first well regions in the surface layer of the drift layer, with a third space region of the first conductivity type sandwiched between the third well region and the second well region;
a source region of the first conductivity type formed in surface layers of the plurality of first well regions;
an ohmic electrode formed on the plurality of first well regions and having ohmic connection with the plurality of first well regions;
a gate insulating film formed on the plurality of first well regions and the second well region;
a field insulating film formed on the third well region;
a gate electrode formed on the gate insulating film and the field insulating film; and
a gate pad formed on the gate insulating film or the field insulating film,
the silicon carbide semiconductor device further comprising:
a unipolar diode provided in a unit cell including the plurality of first well regions; and
a source electrode connected to the unipolar diode and the ohmic electrode and not having ohmic connection with the second well region and the third well region,
wherein the unipolar diode is a reverse conducting diode including:
the source region; and
a channel epitaxial layer of the first conductivity type formed on surfaces of the plurality of first well regions in which the source region is not formed, the channel epitaxial layer having a lower impurity concentration of the first conductivity type than the source region,
the source electrode is connected to the channel epitaxial layer, and
a distance from the channel epitaxial layer formed on the surface of the outermost first well region out of the plurality of first well regions to the third space region is shorter than 1.15 times the film thickness of the drift layer.

* * * * *